US00RE37232E

(19) United States
(12) Reissued Patent
Saeki

(10) Patent Number: US RE37,232 E
(45) Date of Reissued Patent: Jun. 19, 2001

(54) DELAY CIRCUIT DEVICE

(75) Inventor: Takanori Saeki, Tokyo (JP)

(73) Assignee: NEC Corporation, Tokyo (JP)

(21) Appl. No.: 09/460,563

(22) Filed: Dec. 14, 1999

Related U.S. Patent Documents

Reissue of:
(64) Patent No.: 5,699,003
Issued: Dec. 16, 1997
Appl. No.: 08/575,032
Filed: Dec. 19, 1995

(30) Foreign Application Priority Data

Dec. 20, 1994 (JP) ..... 6-316875

(51) Int. Cl.[7] ..... H03H 11/26
(52) U.S. Cl. ..... 327/261; 327/161
(58) Field of Search ..... 327/141, 161, 327/261, 263, 264, 269, 270, 272, 276, 278, 285, 292, 296

(56) References Cited

U.S. PATENT DOCUMENTS 5,054,038 * 10/1991 Hedberg ..... 327/261

FOREIGN PATENT DOCUMENTS 6-164339 6/1994 (JP) .

* cited by examiner

*Primary Examiner*—Jeffrey Zweizig
(74) *Attorney, Agent, or Firm*—Foley & Lardner

(57) ABSTRACT

A delay circuit device is described which includes a first delay circuit series that can extract output from any position on a transmission path of a signal, a second delay circuit series that can enter input from any position on a transmission path of a signal, and a control circuit having an input terminal, an output terminal, and an input/output control terminal for signals. The first delay circuit series and the second delay circuit series are arranged such that their signal transmission paths are aligned in opposite directions; the output of the first delay circuit series and the input of the second delay circuit series passing by way of the control circuit and being sequentially connected to each other from the side close to the input of the first delay circuit series and from the side close to the output of the second delay circuit series. A first signal is inputted to the first delay circuit series, a second signal is inputted to the control circuit at an arbitrary subsequent time, and the first signal in the first delay circuit series is transferred to the second delay circuit series.

50 Claims, 27 Drawing Sheets

DELAY CIRCUIT DEVICE

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a semiconductor circuit device, and particularly to a delay circuit device for use in generating transmitting or controlling synchronous signals (hereinafter referred to as "clock pulse").

2. Description of the Related Art

As shown in FIG. 1, a semiconductor circuit device using clock pulses according to the prior art receives an external clock pulse 401 at reception circuit 402, amplifies the clock pulse at an amplification circuit 403, and generates an internal clock pulse 405 for use in circuit 404. As a result, in the process of receiving at reception circuit 402 and amplifying at amplification circuit 403, a delay time 406 is produced between the external clock 401 and the internal clock 402, as shown in FIG. 2. This delay time 406 tends to increase with increased circuit scale of semiconductor circuit devices achieved through progress in manufacturing techniques and the growing diameter of semiconductor substrates. On the other hand, with the increase in speed of systems mounted in semiconductor circuit devices, circuit operation as well as the clock pulses employed are also increasing in speed. This increase in speed results in an increase in delay time 406 in relation to the clock cycle 407, and presents obstacles to circuit operation.

As a countermeasure, Phase-Locked Loops (hereinafter abbreviated as "PLL") have come into use. FIG. 3 shows the basic circuit structure of a PLL. At phase comparator 504, a phase error signal 506 is outputted from the phase difference of an external clock pulse 501 entering via reception circuit 502 and an internal clock pulse 505 via a delay circuit 503 having a delay equivalent to that of reception circuit 502. Phase error signal 506 becomes control signal 508 after passing through loop filter 507, and is inputted to voltage-controlled oscillator 509. At voltage-controlled oscillator 509, a clock pulse 510 is generated having a frequency corresponding to control signal 508. Clock pulse 510 is amplified at amplification circuit 511 to become internal clock pulse 505 for use in clock-controlled circuit 512. Control signal 508 controls voltage-controlled oscillator 509 such that the phase difference between external clock pulse [503] *501* and internal clock pulse 505 is eliminated, and controls voltage-controlled oscillator 509 until a phase difference is no longer detectable.

In a PLL, the delay of the internal clock pulse with respect to the external clock pulse therefore disappears, and the problem of obstacles to circuit operation due to the relative increase in delay time with respect to clock cycle can thus be avoided.

A configuration incorporating a frequency-dividing circuit in a PLL such as shown in FIG. 4 has come to be used in semiconductor circuit devices employing a clock pulse that has an integer duty ratio or a frequency that is an integer power of the frequency of an external clock.

In phase comparator 504, a phase error signal 506 is outputted from the phase difference between an external clock pulse 501 entering via reception circuit 502 and an internal clock pulse 505 entering via delay circuit 503 having a delay equal to that of reception circuit 502. Phase error signal 506 passes through loop filter 507 to become control signal 508 and is inputted to voltage-controlled oscillator 509. Voltage-controlled oscillator 509 generates a clock pulse 510 having a frequency that corresponds to control signal 508. Clock pulse 510 passes through frequency divider circuit 513 where it undergoes frequency division to become clock pulse 514. Clock pulse 514 is amplified by amplification circuit 511 to become the internal clock pulse 505 used by clock-controlled circuit 512, and clock pulse 510 is amplified by amplification circuit 515 to become the internal clock pulse 516 used by clock-controlled circuit 512. Control signal 508 controls voltage-controlled oscillator 509 so as to eliminate the phase difference between external clock pulse [503] *501* and internal clock pulse 505. Internal clock pulse 505 becomes a clock pulse having the same phase and cycle as external clock pulse 503, and moreover, having an integer duty ratio. Clock 516 has the same frequency as internal clock pulse 505 before frequency division, and therefore, becomes a clock pulse having a frequency-divided inverse frequency with respect to external clock pulse [503] *501*.

SUMMARY OF THE INVENTION

The object of the present invention is to provide a delay circuit device that solves the following drawbacks of a circuit employing the above-described PLL:

1. Time (in excess of several tens of cycles) is required to eliminate the phase difference between the internal clock pulse and external clock pulse.
2. As a result of drawback 1, the PLL must always be operated to provide an internal clock pulse having no phase difference with the external clock pulse at a desired timing, thereby increasing power consumption.
3. Because a voltage-controlled oscillator controls oscillation by voltage, the amplitude of the control voltage drops with a decrease in power source voltage, thereby degrading the accuracy of the controlled frequency.
4. To maintain the accuracy of a fixed controlled frequency when controlling clock pulses over a wide range of frequencies, a plurality of voltage-controlled oscillators having differing frequency ranges must be used, and time is required to eliminate phase difference when voltage-controlled oscillators are switched.
5. Because the conditions used to eliminate phase difference are limited (voltage, device items), often problematic preliminary investigations must be carried out.
6. Many varieties of circuits exist, and it is difficult to deal with defective circuits.

According to the present invention, a delay circuit device is provided which includes a first delay circuit series that can extract output from any position on a transmission path of a signal, a second delay circuit series that can enter input from any position on a transmission path of a signal, and a control circuit having an input terminal, an output terminal, and an input/output control terminal for signals; wherein the first delay circuit series and the second delay circuit series are arranged such that their signal transmission paths are aligned in opposite directions; output of the first delay circuit series and input of the second delay circuit series being passed through the control circuit and sequentially connected to each other from the side close to the input of the first delay circuit series and from the side close to the output of the second delay circuit series; and wherein a first signal is inputted to the first delay circuit series, a second signal is inputted to the control circuit at any time thereafter, and the first signal in the first delay circuit series is transferred to the second delay circuit series.

According to an embodiment of the present invention, the second signal is inputted to the control circuit, the first signal on the first delay circuit series is transferred to the second delay circuit series, and the first signal on the first delay circuit series is removed from the first delay circuit series.

According to another embodiment of the present invention, the first delay circuit series and the second delay circuit series are constructed such that the delay times of both series are equal.

According to another embodiment of the present invention, voltage impressed to the first delay circuit series and the second delay circuit series is supplied from a constant-voltage power source.

According to another embodiment of the present invention, in a circuit having a plurality of voltage sources, the voltage impressed to the first delay circuit series and the second delay circuit series is supplied from a relatively high voltage source.

According to another embodiment of the present invention, a delay circuit device includes a reception circuit for external signals, an amplification circuit, a first delay circuit having a delay time equal to that of the reception circuit, and a second delay circuit having a delay time equal to that of the amplification circuit; wherein a first signal is inputted to the first delay circuit series after sequentially progressing through the reception circuit, the first delay circuit, and the second delay circuit; the first signal is inputted to the control circuit after passing through the reception circuit; and the output of the second delay circuit series is inputted to the amplification circuit.

According to another embodiment of the present invention, the first signal and the second signal are composed of synchronous signal pulses having a fixed cycle within a prescribed permissible range of error; the second signal being a pulse later than the first pulse a prescribed number of pulses.

According to another embodiment of the present invention, a delay circuit device includes a third delay circuit that enables selection of a plurality of delay times by a plurality of control signals and a fourth delay circuit having the same configuration as the third delay circuit; the third delay circuit being arranged serially in the input path of the first delay circuit series; the fourth delay circuit being arranged serially in the output path of the second delay circuit series; and the third delay circuit and the fourth delay circuit being controlled so as to have equal delay times.

According to an embodiment of the present invention, the first delay circuit series and the second delay circuit series are principally composed of inverters and NANDs.

According to another embodiment of the present invention, the internal circuit of the first delay circuit series and the internal circuit of the second delay circuit series are composed of a circuit layouts that have a mirror-image relation to each other.

According to another embodiment of the present invention, the first signal and the second signal are synchronous signals or clock pulses.

According to another embodiment of the present invention, the sum of the delay times of the first delay circuit and the second delay circuit is set to a time equal to the signal width of the external signals subtracted from the sum of the delay time of the reception circuit and the delay time of the amplification circuit; the first signal is inputted to the first delay circuit series after having sequentially passed through the reception circuit, the first delay circuit, and the second delay circuit; the first signal is inputted to the control circuit after passing through the reception circuit, and the output of the second delay circuit series is inputted to the amplification circuit after having been inverted.

According to another embodiment of the present invention, a delay circuit device is configured to allow regulation of the delay time of the first delay circuit by an electrical signal, and includes a fuse circuit for generating the electrical signal.

According to another embodiment of the present invention, a delay circuit device further includes a switching circuit for switching the signal path to a route that passes directly from the reception circuit to the amplification circuit without passing through the first delay circuit series, the second delay circuit series, the first delay circuit, and the second delay circuit when the interval between the first signal and the second signal is greater than the sum of the maximum delay time of the first delay circuit series, the delay time of the first delay circuit, and the delay time of the second delay circuit; and for switching the signal path from a route that passes directly from the reception circuit to the amplification path to a route that passes through the first delay circuit series, the second delay circuit series, the first delay circuit, and the second delay circuit when the interval between the first signal and the second signal is shorter than the sum of the maximum delay time of the first delay circuit series, the delay time of the first delay circuit, and the delay time of the second delay circuit.

According to another embodiment of the present invention, the switching circuit includes a hysteresis.

According to another embodiment of the present invention, a delay circuit device includes activation circuits that generate a first activation signal and a second activation signal; and wherein the first activation signal activates the reception circuit; the second activation signal activates input to the first delay circuit series, the second delay circuit series, the first delay circuit, and the second delay circuit; and when either the first or the second activation signal is in an inactive state, all signals within the first delay circuit series are removed.

According to another embodiment of the present invention, the activation circuits are controlled by either active signals or power-down signals of synchronous memory circuit devices.

According to another embodiment of the present invention, a delay circuit device further includes clock output control circuit that generates an output control signal; wherein the output control signal controls the output from the amplification circuit of the first signal or the second signal; and the output control signal is controlled by a read mode signal, a burst mode signal, and a CAS latency signal of a synchronous memory circuit device.

According to another embodiment of the present invention, a delay circuit device further includes a clock mode signal generation circuit that generates a clock mode signal; wherein the clock mode signal switches the signal path from a route that passes directly from the reception circuit to the amplification circuit or to a route that passes through the first delay circuit series, the second delay circuit series, the first delay circuit, and the second delay circuit.

According to another embodiment of the present invention, a delay circuit device is configured to allow regulation of the delay time of the first delay circuit by an electrical signal; the electrical signal being a signal that eliminates phase difference between an external signal and the output of the amplification circuit; the delay circuit device further including a phase comparison circuit for generating the electrical signal.

According to another embodiment of the present invention, the delay time of the second delay circuit series is set by a load regulation circuit connected to the second delay circuit series.

According to another embodiment of the present invention, the load of the load regulation circuit is controlled by a signal for controlling load.

According to another embodiment of the present invention, the second delay circuit series is made up of a plurality of delay circuit series, this plurality of delay circuit series making up the second delay circuit series each having a prescribed delay time ratio with respect to the first delay circuit series; and the first signal and second signal having cycles of various ratios with respect to the cycle of the synchronous signal.

According to another embodiment of present invention, the fifth delay circuit is arranged in the next section following the second delay circuit series; the delay time of the first delay circuit series and the delay time of the second delay circuit series are set at a prescribed ratio; the ratio between the sum of the delay time of the first delay circuit and the delay time of the second delay circuit and the delay time of the fifth delay circuit is set to equal the ratio between the delay time of the first delay circuit series and the delay time of the second delay circuit series; and the output of the fifth delay circuit, the OR output of the output of the fifth delay circuit and the output of the reception circuit, the output of an RS flip-flop that takes as reset and set inputs the output of the fifth delay circuit and the output of the reception circuit, or the frequency-divided OR output is inputted to the amplification circuit.

According to another embodiment of the present invention, the fifth delay circuit is arranged in the next section following the second delay circuit series; the second delay circuit series is made up of a plurality of delay circuit series; the delay time of the first delay circuit series and the delay time of the second delay circuit Series are set at a prescribed ratio; the ratio between the sum of the delay time of the first delay circuit and the delay time of the second delay circuit and the delay time of the fifth delay circuit is set to equal the ratio between the delay time of the first delay circuit series and the delay time of the second delay circuit series; and the output of the fifth delay circuit, the OR output of the output of the fifth delay circuit and the output of the reception circuit, the output of an RS flip-flop that takes as reset and set inputs the output of the fifth delay circuit and the output of the reception circuit, or the frequency-divided output of this OR output is inputted to the amplification circuit.

According to another embodiment of the present invention, the second delay circuit series is made up of two delay circuit series; the delay time of the first delay circuit series and the delay time each of the two delay circuit series of the second delay circuit series are set at a 2-to-1 ratio; the ratio between the sum of the delay time of the first delay circuit and the delay time of the second delay circuit and the delay time of the fifth delay circuit is set to equal the ratio between the delay time of the first delay circuit series and the delay time of the second delay circuit series; the output of the first delay circuit series passes through the control circuit; the OR output of the output of the first delay circuit series and the output of the second delay circuit series is inputted to the fifth delay circuit; and the OR output of the output of the fifth delay circuit and the output of the reception circuit, the output of an RS flip-flop that takes as reset and set inputs the output of the fifth delay circuit and the output of the reception circuit, or the frequency-divided output of this OR output is inputted to the amplification circuit.

According to another embodiment of the present invention, the ratio between the delay times of the first delay circuit series and the second delay circuit series is set to the ratio between the number of circuits making up the first delay circuit series and the number of circuits making up the second delay circuit series.

According to another embodiment of the present invention, the first delay circuit series and the second delay circuit series are in a loop formation; and the delay circuit device further includes a counter which, from an arbitrary time after the first delay circuit series inputs the first signal and until the control circuit inputs the second signal, counts the number of times the first signal completes laps around the first delay circuit series formed as a loop; and when the control circuit inputs the second signal, causes the first signal on the first delay circuit series to be transferred to the second delay circuit series, and at the same time, subtracts from the counted number of laps each time the first signal completes a lap around the second delay circuit series, and when the first signal has completed the same number of laps around the second delay circuit series as completed around the first delay circuit series, causes the first signal to be outputted from the second delay circuit series.

According to another embodiment of the present invention, the counter includes an adder that counts the number of laps completed by the first signal around the first delay circuit series formed as a loop until the control circuit inputs the second signal; a transmitter that transfers the first signal on the first delay circuit series to the second delay circuit series when the control circuit inputs the second signal, and at the same time, outputs the number of laps counted by the adder; and a subtracter that subtracts from the outputted number of laps each time the first signal completes a lap around the second delay circuit series, and when the first signal has completed the same number of laps around the second delay circuit series as completed around the first delay circuit series, outputs the first signal from the second delay circuit series.

According to another embodiment of the present invention, a delay circuit device further includes a switching circuit that, when the counter indicates the maximum value, switches the signal path to a route that passes directly from the reception circuit to the amplification circuit without passing through the first delay circuit series, the second delay circuit series, the first delay circuit and the second delay circuit; and the second signal is inputted when the counter indicates a value less than the maximum value, switches the signal path from a route that directly passes from the reception circuit to the amplification circuit to a route that passes through the first delay circuit series, the second delay circuit series, the first delay circuit, and the second delay circuit.

According to another embodiment of the present invention, the switching circuit includes a hysteresis.

According to the present invention, a delay circuit device is provided which has a first delay circuit series that can extract output from any position on a transmission path of a signal, a second delay circuit series that can enter input from any position on a transmission path of a signal, and a control circuit having an input terminal, an output terminal, and an input/output control terminal for signals. The first delay circuit series and the second delay circuit series are arranged such that their signal transmission paths are aligned in opposite directions; output of the first delay circuit series and input of the second delay circuit series being passed through the control circuit and sequentially connected to each other from the side close to the input of the first delay circuit series and from the side close to the output of the second delay circuit series. A first signal is inputted to the first delay circuit series, a second signal is inputted to the control circuit at any time thereafter, and the first signal in the first delay circuit series is transferred to the second delay circuit series.

The first signal progresses through the first delay circuit series for the time of the difference between the input times of the first signal and the second signal.

After the second signal is inputted to the control circuit and the first signal on the first delay circuit series is transferred to the second delay circuit series, the first signal proceeds within the second delay circuit series for the time period equal to the value of the transfer speed of signals of the second delay circuit series divided by the transfer speed of signals of the first delay circuit series multiplied by the difference between the input times of the first signal and the second signal. In other words, a delay circuit series is provided having a delay time equal to the difference between input times of the first signal and second signal.

Here, the delay circuit device is configured such that the transfer speed of signals of the first delay circuit series is equal to the transfer speed of signals of the second delay circuit series; the delay circuit device includes a reception circuit of external signals, an amplification circuit, a first delay circuit having delay time equal to that of the reception circuit, a second delay circuit having delay time equal to that of the amplification circuit. The first signal is inputted to the first delay circuit series after passing sequentially through the reception circuit, the first delay circuit, and the second delay circuit, the first signal is inputted to the control circuit as the second signal after passing through the reception circuit, and the output of the second delay circuit series is inputted to the amplification circuit. When the first signal is inputted as a clock pulse signal having a fixed cycle, the time difference from the entry of the first signal into the first delay circuit series to its input one cycle later to the control circuit as the second signal after having passed through the reception circuit is made equal to the sum of the delay time of the reception circuit and the delay time of the amplification circuit subtracted from the cycle of the first signal. This output of the second delay circuit series is inputted to the amplification circuit.

The output of this amplification circuit provides the internal circuit with a signal having a timing that is substantially equal to that of the first signal from the outside at a time delay of exactly two cycles of the first signal from the time the first signal is inputted to the reception circuit.

In addition, a fifth delay circuit is arranged in the next section following the second delay circuit series; the delay times of the first delay circuit series and the second delay circuit series are set to a prescribed ratio; the ratio between the sum of the delay time of the first delay circuit and the delay time of the second delay circuit and the delay time of the fifth delay circuit is made equal to the ratio between the first delay circuit series and the second delay circuit series; and the OR output of the output of the fifth delay circuit and the output of the reception circuit, the RS flip-flop output, or the frequency-divided output of OR output is inputted to the amplification circuit. The pulse of this OR output is a pulse having the cycle of the externally inputted clock pulse at the ratio of the delay times of the first delay circuit series and the second delay circuit series to which a new clock pulse is added, and when the ratio is two, a clock pulse having one half the cycle of the externally inputted pulse and twice the frequency is provided to the internal circuit within the time of one clock cycle. The output of the RS flip-flop, or the frequency-divided output of the OR output provides the internal clock with a clock pulse having a duty cycle equal to the ratio between the delay time of the first delay circuit series and the delay time of the second delay circuit series within the time of two clock cycles.

Furthermore, in the delay circuit device of the present invention the ratio between the delay times of the first delay circuit series and the second delay circuit series is set to the ratio between the number of circuits making up the first delay circuit series and the number of circuits making up the second delay circuit series.

In addition, a counter is disposed in the delay circuit device, and moreover, the first delay circuit series and the second delay circuit series are in a loop formation; and from an arbitrary time after the first signal is inputted to the first delay circuit series and until the control circuit inputs the second signal, the counter counts the number of times the first signal completes laps around the first delay circuit series formed as a loop; and when the second signal is inputted to the control circuit and the transmitter, the first signal on the first delay circuit is transferred to the second delay circuit series, and at the same time, the number of laps counted at the counter is subject to subtraction each time the first signal completes a lap around the second delay circuit series, and when the first signal has completed the same number of laps around the second delay circuit series as completed around the first delay circuit series, the first signal is outputted from the second delay circuit series. In other words, the arrangement of a counter enables the provision of an internal clock pulse having no delay time difference with an external clock pulse or a clock pulse having any duty cycle or any cycle, even for a clock pulse having a cycle several times longer than the first delay circuit series and the second delay circuit series.

The delay circuit device has a structure that allows regulation of the delay time of the first delay circuit by an electrical signal, and includes a fuse circuit for generating this electrical signal. In other words, changes in settings can be effected by fuse trimming in the event of changes in specification or the occurrence of a time difference between the external clock and the internal clock after manufacture.

In addition, the delay circuit device includes a switching circuit which switches the signal path to a route that passes directly from the reception circuit to the amplification circuit without passing through the first delay circuit series, the second delay circuit series, the first delay circuit, and the second delay circuit when the interval between the first signal and the second signal is longer than the sum of the maximum delay time of the first delay circuit series, the delay time of the first delay circuit, and the delay time of the second delay circuit; and which switches the signal path from a route that passes directly from the reception circuit to the amplification circuit to a route that passes through the first delay circuit series, the second delay circuit series, the first delay circuit and the second delay circuit when the space between the first signal and the second signal is shorter than the sum of the maximum delay time of the first delay circuit series, the delay time of the first delay circuit, and the delay time of the second delay circuit. Because the switching circuit that switches the signal path from a route that passes directly from the reception circuit to the amplification circuit to a route that passes through the first delay circuit series, the second delay circuit series, the first delay circuit, and the second delay circuit further includes a hysteresis, a clock pulse can be provided to the internal circuit even when the external clock cycle exceeds the set maximum value of the circuit of the present invention.

Further, because the delay circuit device of the present invention synchronizes with the external clock within two clocks, clocks can be easily controlled by control signals of a synchronous memory device by adding a number of control circuits, an example of which follows. The delay circuit device includes an activation circuit that generates a first activation signal and a second activation signal, whereby the first activation signal activates the reception circuit, the second activation signal activates input to the first delay circuit series, the second delay circuit series, the first delay circuit, and the second delay circuit; and when either the first activation signal or the second activation signal is in an inactive state, all signals are removed from the first delay circuit series. The activation circuit can be controlled by either an active signal or a power-down signal of a synchronous memory circuit device. A clock output control circuit that outputs a clock output control signal is included, the clock output control signal controls the output of the first signal or the second signal from the amplification circuit, and the clock output control signal is in turn controlled by a read mode signal, burst mode signal, and CAS latency signal of the synchronous memory circuit device. A clock mode signal generation circuit is included that generates a clock mode signal, and this clock mode signal switches between a route that passes directly from the reception circuit to the amplification circuit and a route that passes through the first delay circuit series, the second delay circuit series, the first delay circuit, and the second delay circuit.

The configuration of the delay circuit device allows regulation of the delay time of the first delay circuit by an electrical signal, this being a signal that eliminates the phase difference between external signal and the output of the amplification circuit, and the delay circuit device includes a phase comparison circuit for generating this electrical signal. In other words, the phase difference between the external clock pulse and the internal clock pulse can be more accurately matched through a phase comparison circuit. However, since the phases are matched in advance even without a phase comparison circuit, phase regulation using a phase comparison circuit for correction can be accomplished in an extremely short time interval. In addition, a circuit using a phase comparison circuit enables control of clock pulse over a wide range of frequencies.

The present invention has the following effects:

1. The phase difference between an external clock pulse and an internal clock pulse can be reduced to less than the delay of internal amplification, and an internal clock pulse having a prescribed phase difference can be supplied within a minimum of two cycles.
2. As a result of the first effect, the circuit of the present invention need not be operated constantly in order to use an internal clock pulse having no phase difference with an external clock pulse at a prescribed timing, and therefore, [no] power consumption does not increase.
3. Because the circuit of the present invention employs a plurality of delay circuits having mutually equivalent delay characteristics, the range of controlled frequencies does not change even should the power supply voltage drop.
4. Controlling a clock pulse over a wide range of frequencies while maintaining the accuracy of a fixed control frequency can be achieved by simply increasing the number of circuit sections, and when using a plurality of delay circuits in accordance with the frequency range, phase differences can be eliminated within just two cycles after switching delay circuits.
5. The conditions for eliminating phase difference (voltage, device conditions) are unlimited, and preliminary investigations are virtually unnecessary.
6. Few types of circuits are used, and defective elements can be dealt with easily.
7. Because a totally digital circuit is employed, control can be easily effected through use of a counter, and when controlling a clock of large cycle, the number of times the clock circulates in the delay circuit can be counted using the counter, thereby avoiding a drastic increase in the number of circuits and achieving control over a wide range of cycles.
8. Ease of control allows an inputted external clock that exceeds the range of control to be switched to a circuit that does not pass through the two delay circuit series of the present invention, thereby avoiding malfunctions.
9. Because phase differences can be eliminated in two cycles, a clock pulse may be controlled using the command signals or internal signals of a synchronous memory circuit device, and moreover, the control operation need be effected only when necessary within the overall circuit of a memory circuit device, and during standby, operation can be halted to conserve power.
10. Setting of the duty ratio and clock cycle can be easily effected by regulating the ratio between the delay times of the two delay circuit series.
11. By using a phase comparison circuit, phase difference between an external clock pulse and internal clock pulse can be more accurately matched. Moreover, because the phase is matched in advance even without a phase comparison circuit, phase regulation using phase comparison circuit for correction can be carried out in an extremely short time. In addition, a circuit using a phase comparison circuit enables control over a wide range of frequencies.
12. Clock timing can be set through use of a fuse or external signal even after completion of the delay circuit device or after installation of the system.

The above and other objects, features, and advantages of the present invention will become apparent from the following description with references to the accompanying drawings which illustrate examples of preferred embodiments of the present invention.

DETAILED DESCRIPTION OF THE PREFERRED EMBODIMENTS

The First Embodiment

Figure 1:
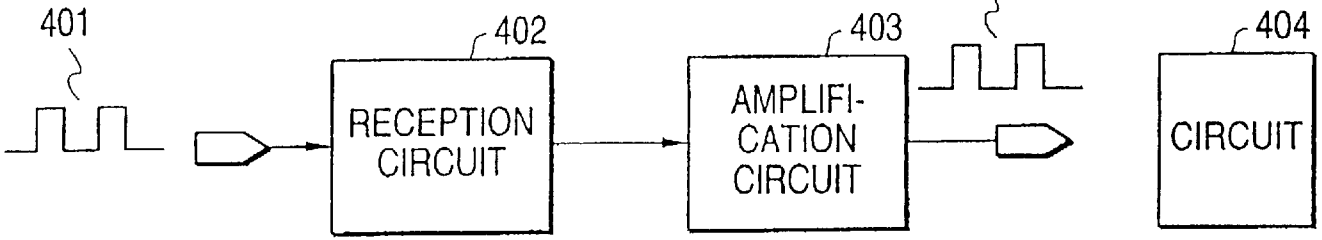
FIG. 1 (PRIOR ART)
FIG. 1 is a circuit diagram showing a delay circuit of the prior art which does not use a PLL.
Figure 2:
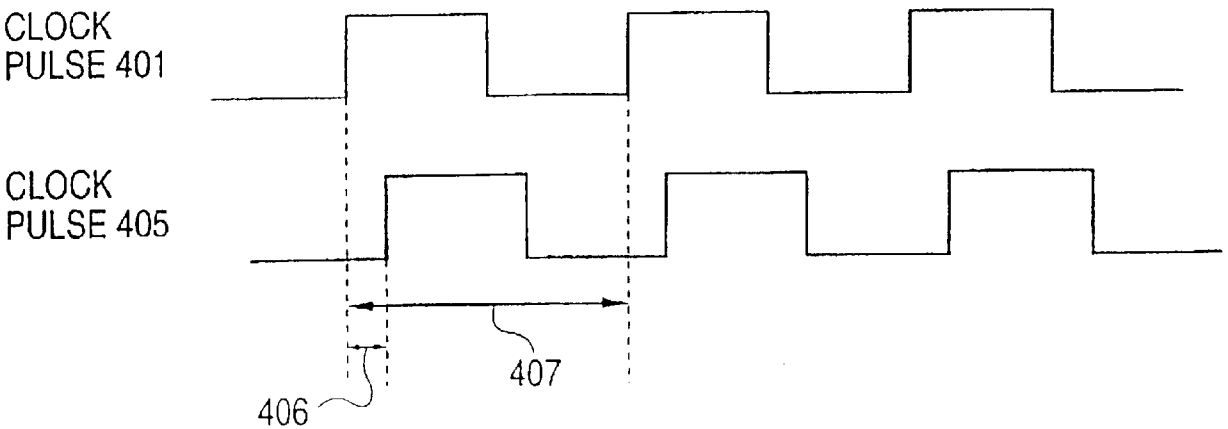
FIG. 2 (PRIOR ART)
FIG. 2 is a waveform chart illustrating the operation of the delay circuit shown in FIG. 1.
Figure 3:
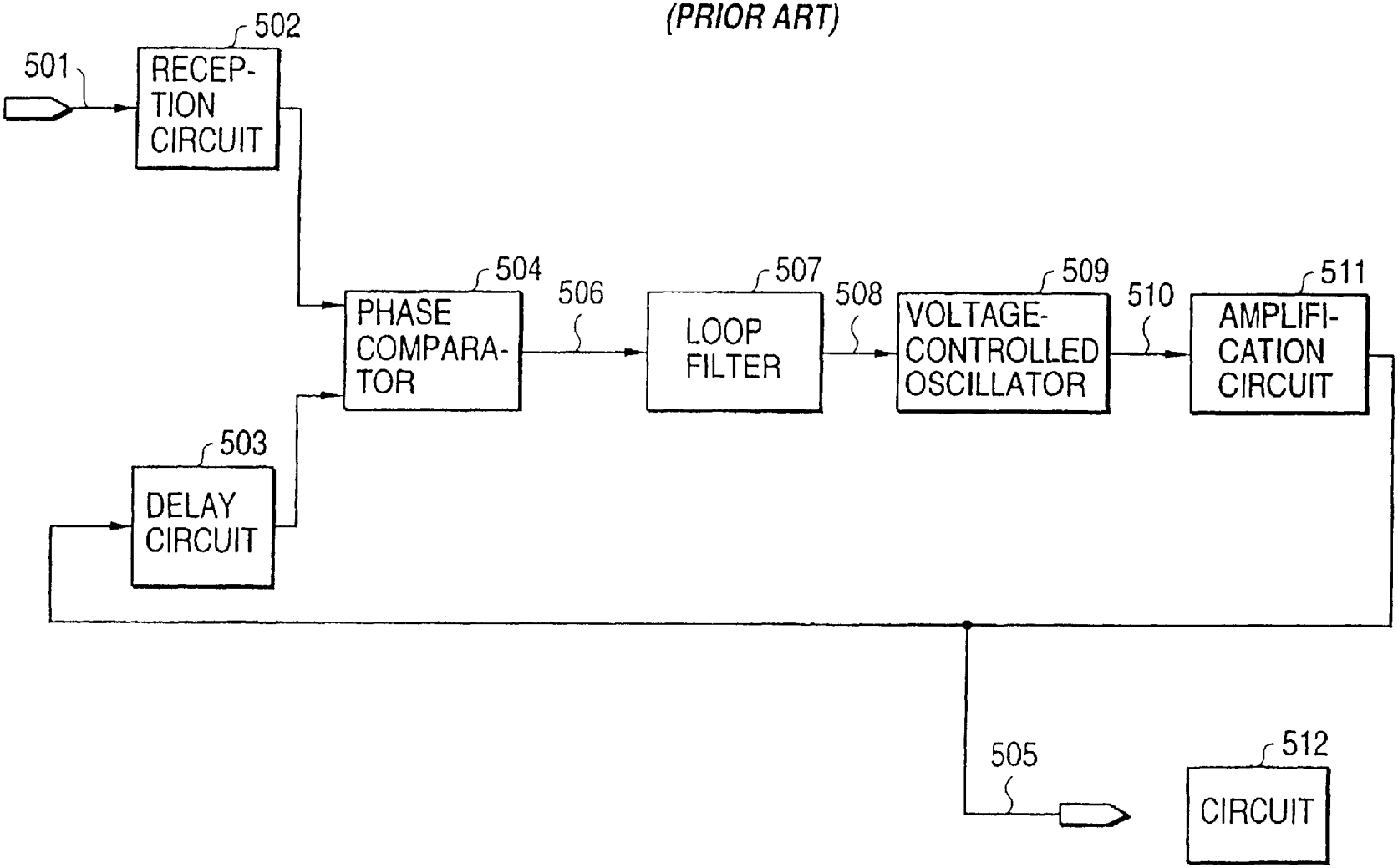
FIG. 3 (PRIOR ART)
FIG. 3 is a circuit diagram showing a delay circuit of the prior art which uses a PLL.
Figure 4:
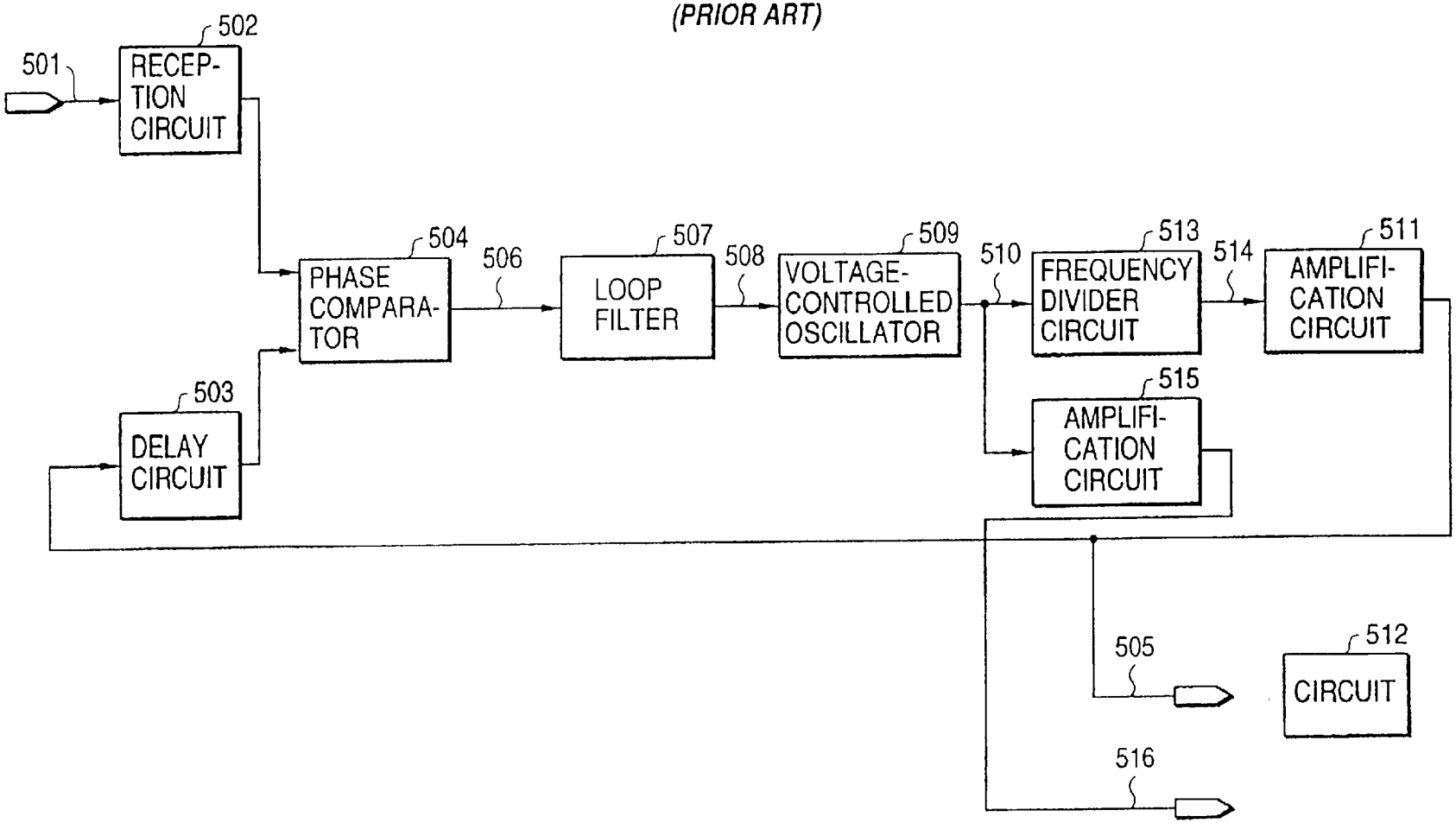
FIG. 4 (PRIOR ART)
FIG. 4 is a circuit diagram showing a delay circuit of the prior art which uses a PLL and frequency-dividing circuit.
Figure 5:
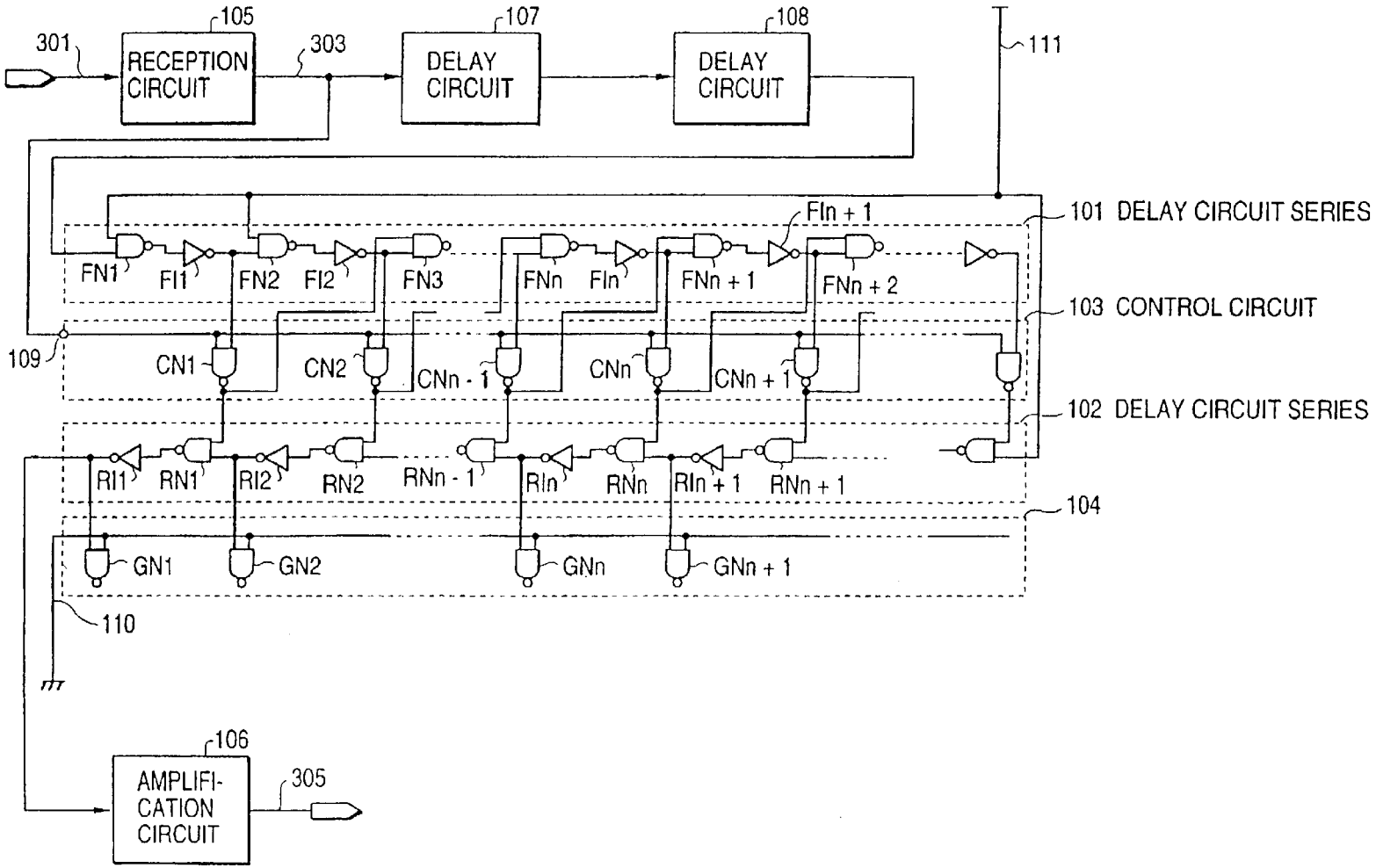
FIG. 5 is a circuit diagram showing the first embodiment of the delay circuit device of the present invention.
Figure 6:
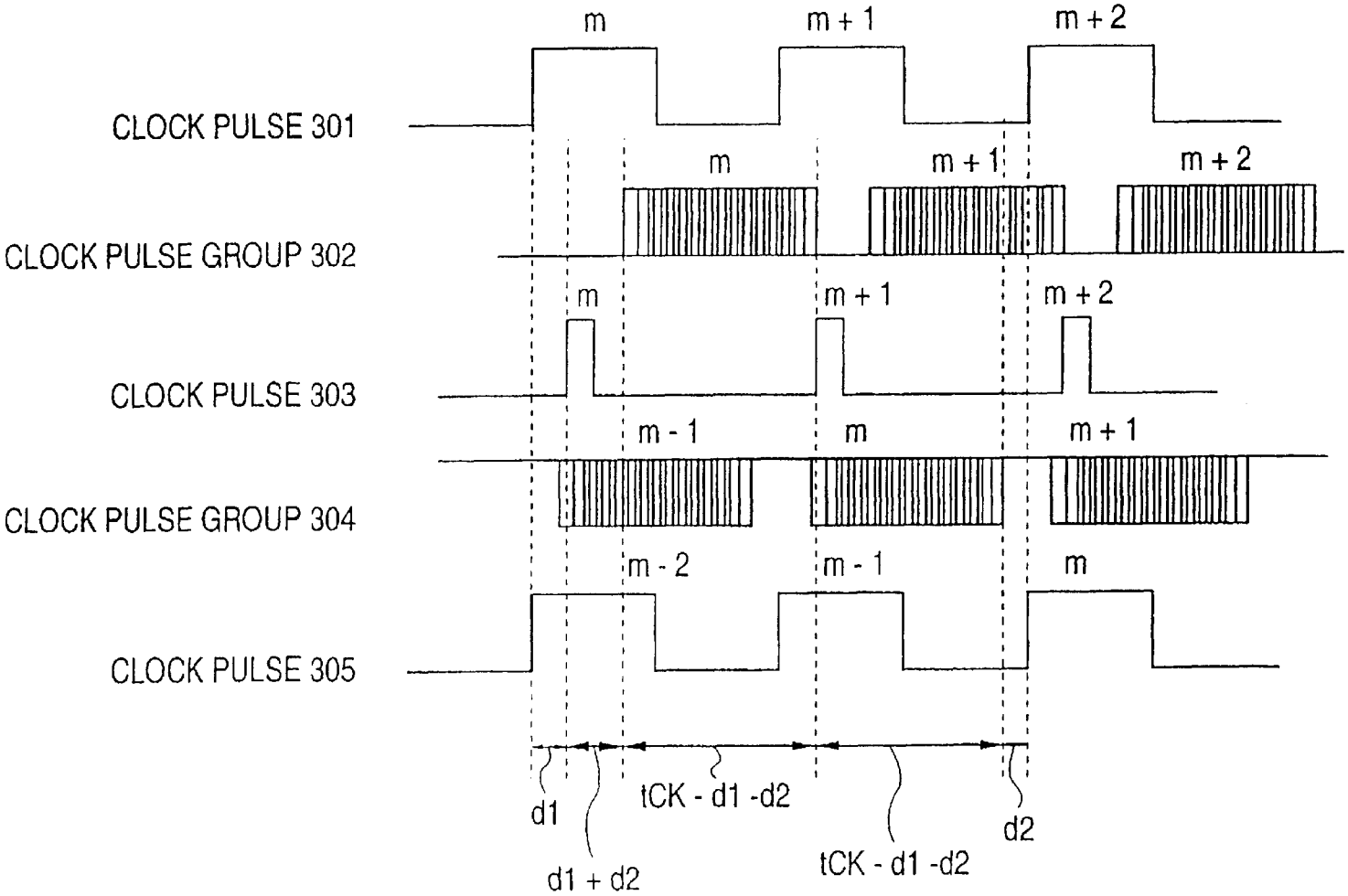
FIG. 6 is a waveform chart illustrating the operation of the first embodiment.

FIGS. 5 and 6 show the first embodiment of the present invention.

Referring to FIG. 5, the present embodiment is made up of a delay circuit series 101 that can extract output from an arbitrary position of a signal transfer path, a delay circuit series 102 that can input from an arbitrary position of a signal transfer path, a control circuit 103 having a signal input terminal and output terminal and an input/output control terminal 109, a load regulation element 104 for leveling the load of delay circuit series 101 and delay circuit series 102, a reception circuit 105 that receives external signals, an amplification circuit 106, a delay circuit 107 having a delay time equal to reception circuit 105, and a delay circuit 108 having a delay time equal to amplification circuit 106. The output 303 of reception circuit 105 is connected to the input of delay circuit 107 and control terminal 109. The output 303 of delay circuit 107 is connected to the input of delay circuit 108. The output of delay circuit 108 is connected to the input of delay circuit series 101. The output of delay circuit series 102 is connected to the input of amplification circuit 106.

Explanation will next be given regarding the internal configuration of delay circuit series 101, delay circuit series 102, control circuit 103, and load regulation element 104. Delay circuit series 101 and delay circuit series 102 are made up of alternately arranged inverters and NANDs, and control circuit 103 and load regulation element 104 are made up of NANDs. Delay circuit series 101 is composed of NAND FN1, inverter FI1. NAND FN2, inverter FI2, . . . , NAND FNn, inverter FIn, NAND FNn+1, inverter FIn+1, . . . connected in this order from the input side. Delay circuit series 102 is composed of inverter RI1, NAND RN1, inverter RI2, NAND RN2, . . . , inverter RIn, NAND RNn, inverter RIn+1, NAND RNn+1, . . . connected in this order from the output side. Control circuit 103 is composed of NAND series NAND CN1, NAND CN2, . . . NAND CNn, NAND CNn+1, . . . . having one input terminal connected to control terminal 109. Load regulation element 104 is composed of NAND series NAND GN1, NAND GN2, . . . , NAND GNn, NAND GNn+1, . . . having one input terminal connected to ground line 110.

Next, the mutual connection of delay circuit series 101, delay circuit series 102, control circuit 103, and load regulation element 104 will be explained with respect to the nth element of each. The output of inverter PIn of delay circuit series 101 is both inputted to NAND FNn+1 and connected to the one input terminal of the two input terminals of NAND CNn of control circuit 103 that is not connected to control terminal 109. The output of NAND CNn of control circuit 103 is connected to the one input terminal of the two input terminals of NAND FNn+2 of delay circuit series 101 that is not connected to the output of inverter FIn+1, and to the one input terminal of the two input terminals of NAND RNn of delay circuit series 102 that is not connected to the output of inverter RIn+1. The output of NAND RNn of delay circuit series 102 is connected to the input of inverter RIn of delay circuit series 102. The output of inverter RIn of delay circuit series 102 is both inputted to NAND RNn−1 and connected to the input terminal of the two input terminals of NAND GNn of load regulation element 104 that is not connected to the ground line 110. The output of NAND GNn of load regulation element 104 is left unconnected. In addition, the input terminal of the two input terminals of NAND FN1 of delay circuit series 101 that is not connected to the input terminal of delay circuit series 101, the input terminal of the two input terminals of NAND FN2 that is not connected to the output of inverter FI1, the input terminal of the two input terminals of NAND FN2 that is not connected to the output of inverter FI1, and the input of the two inputs of the last NAND of delay circuit series 102 that is not connected to the output of the last NAND of control circuit 103 are all connected to power source line 111.

The operation of the present embodiment will next be explained with reference to FIG. 6.

Input clock 301 is a low-cycle H (high-level) pulse using a leading edge. Clock group 302 indicates clocks that proceed within delay circuit series 101 and is the entire inverter output within delay circuit series 101. Clock 303 is the output of reception circuit 105 and indicates a clock inputted to control terminal 109. Clock group 304 indicates a clock that proceeds within delay circuit series 102 according to all inverter output within delay circuit series 102. Clock 305 indicates the output of amplification circuit 106. Because these clocks are cyclically inputted to this delay circuit device, individual pulses are not distinguished during actual use, but in the interest of simplifying explanation of the operation, one arbitrary clock pulse will be identified as the $m^{th}$ clock, the next clock pulse will be identified as the $m+1^{th}$ clock, and the following clock pulse will be identified as the $m+2^{th}$ clock.

After reception circuit 105, the $m^{th}$ clock enters delay circuit series 101 by way of delay circuit 107 (which has a delay time equal to that of reception circuit 105) and delay circuit 108 (which has a delay time equal to that of amplification circuit 106), proceeds through delay circuit series 101, and is represented by the $m^{th}$ clock group within clock group 302. The inverter output within delay circuit series 101 becomes H with the progression of the $m^{th}$ clock and remains H output for the duration of the $m^{th}$ clock pulse width. One clock cycle after the $m^{th}$ clock leaves reception circuit 105, the $m+1^{th}$ clock is inputted to control terminal 109 from reception circuit 105 and is represented by the $m+1^{th}$ clock of clock 303. At this time, the $m^{th}$ clock is proceeding through delay circuit series 101, and, for example, while the width of the $m^{th}$ clock from the $j^{th}$ inverter FIj (the first inverter of the H pulse) to the $j\text{-}k^{th}$ inverter FIj-k (the last inverter of the H pulse) proceeds within delay circuit series 101, the output from the $j^{th}$ inverter FIj to the $j\text{-}k^{th}$ inverter FIj-k is H output as described above. Accordingly, both inputs for NANDs from CNj to CNj-k of control circuit 103 connected to the outputs of inverters from FIj to FIj-k within the progress of the $m^{th}$ clock are H, and the output becomes L (low level). As a result, although both NAND inputs within delay circuit series 102 are in stand-by at H, one of the two inputs of NANDs from RNj to RNj-k within delay circuit series 102 connected to NANDs from CNj to CNj-k within control circuit 103 becomes L, the output switches from H to L, and the $m^{th}$ clock proceeds within delay circuit series 102 as an L pulse which is represented by the $m^{th}$ clock group within clock group 304. Further, of the two inputs for NANDs from FNj+2 to FNj-k+2 within delay circuit series 101, the input connected to NANDs from CNj to CNj-k of control circuit 103 becomes L, and consequently, all outputs of inverters from FIj+2 to FIj-k+2 become L and the $m^{th}$ clock within delay circuit series 101 becomes L. The $m^{th}$ clock leaving delay circuit series 102 is outputted by way of amplification circuit 106 and is represented by the $m^{th}$ clock of clock 304.

The delay times will next be explained.

As explained hereinabove, the delay times of reception circuit 105 and delay circuit 107 are equal and will be identified as d1. Also as described hereinabove, the delay times of amplification circuit 106 and delay circuit 108 are equal, and will be identified as d2. The cycle of the clock is tCK. The delay between the leading edge of the $m^{th}$ clock of input clock 301 and the leading edge of the $m^{th}$ clock of output clock 303 of reception circuit 105 is d1. The delay between the leading edge of the $m^{th}$ clock of output clock 303 of reception circuit 105 and the leading edge of the first clock of the $m^{th}$ clock group of clock group 302 progressing through delay circuit series 101 is equal to the delay between the leading edge of the $m^{th}$ clock of output clock 303 of reception circuit 105 and the leading edge of the $m+1^{th}$ clock of output clock 303 of reception circuit 105, and this delay is tCK. Accordingly, the time for the clock leading edge to progress through delay circuit series 101 is tCK−d1−d2, or the delay time d1 of delay circuit 107 and the delay time d2 of delay circuit 108 subtracted from the clock cycle tCK. The delay circuits of delay circuit series 102 through which the leading edge of the L pulse of the clock progresses have an equal number of constituent sections as the delay circuits of delay circuit series 101 through which the clock leading edge passes, and therefore, the time fop progression of the leading edge of the L pulse of the clock through delay circuit series 102 is equal to the time for progression of the leading edge of the clock through delay circuit series 101, this time being the delay time d1 of delay circuit 107 and the delay time d2 of delay circuit 108 subtracted from the clock cycle tCK, or tCK−d1−d2. The time required to pass through amplification circuit 106 is d2, as described hereinabove. The time to pass through reception circuit 105, delay circuit 107, delay circuit 108, delay circuit series 101, delay circuit series 102, and amplification circuit 106 is 2tCK, and the $m^{th}$ clock is outputted to an internal circuit (not shown) at the same timing as the $m+2^{th}$ clock.

Further, in the present embodiment, to equalize the delay time of delay circuit series 101 and delay circuit series 102, the mask pattern of FNn, FIn and CNn is, for example, made the mirror image of the mask layout of RNn, RIn and GNn, thereby equalizing load (being all gates and wiring connected to delay circuit series 101 and 102, control circuit 103 for delay circuit series 101 and load regulation element 104 for delay circuit series 102).

The power voltage supplied to the delay circuit device of the present embodiment is supplied from a constant-voltage supply circuit mounted on a semiconductor circuit device on which is mounted the circuit device of the present embodiment. Accordingly, the delay time of the delay circuit device of the present embodiment does not depend on an external power source voltage. In addition, by regulating the voltage supplied from the constant-voltage supply circuit, the number of employed gate sections in delay circuit series 101 and delay circuit series 102 can be regulated because the signal transfer speed in delay circuit series 101, 102 is fast when a high voltage is supplied from the constant-voltage supply circuit, and slow when a low voltage is supplied.

According to the present embodiment, an internal clock having no delay difference with the external clock can be obtained with certainty after just two clock pulses.

While delay circuit series 101, delay circuit series 102, control circuit 103, load regulation element 104 of the present embodiment are each composed of NANDs and inverters, these components may be composed of other elements. In addition, error in the external clock 201 is permissible within a range not influencing the operation of the internal circuits.

The Second Embodiment

The second embodiment of the present invention will next be explained with reference to FIG. 7.

Figure 7:
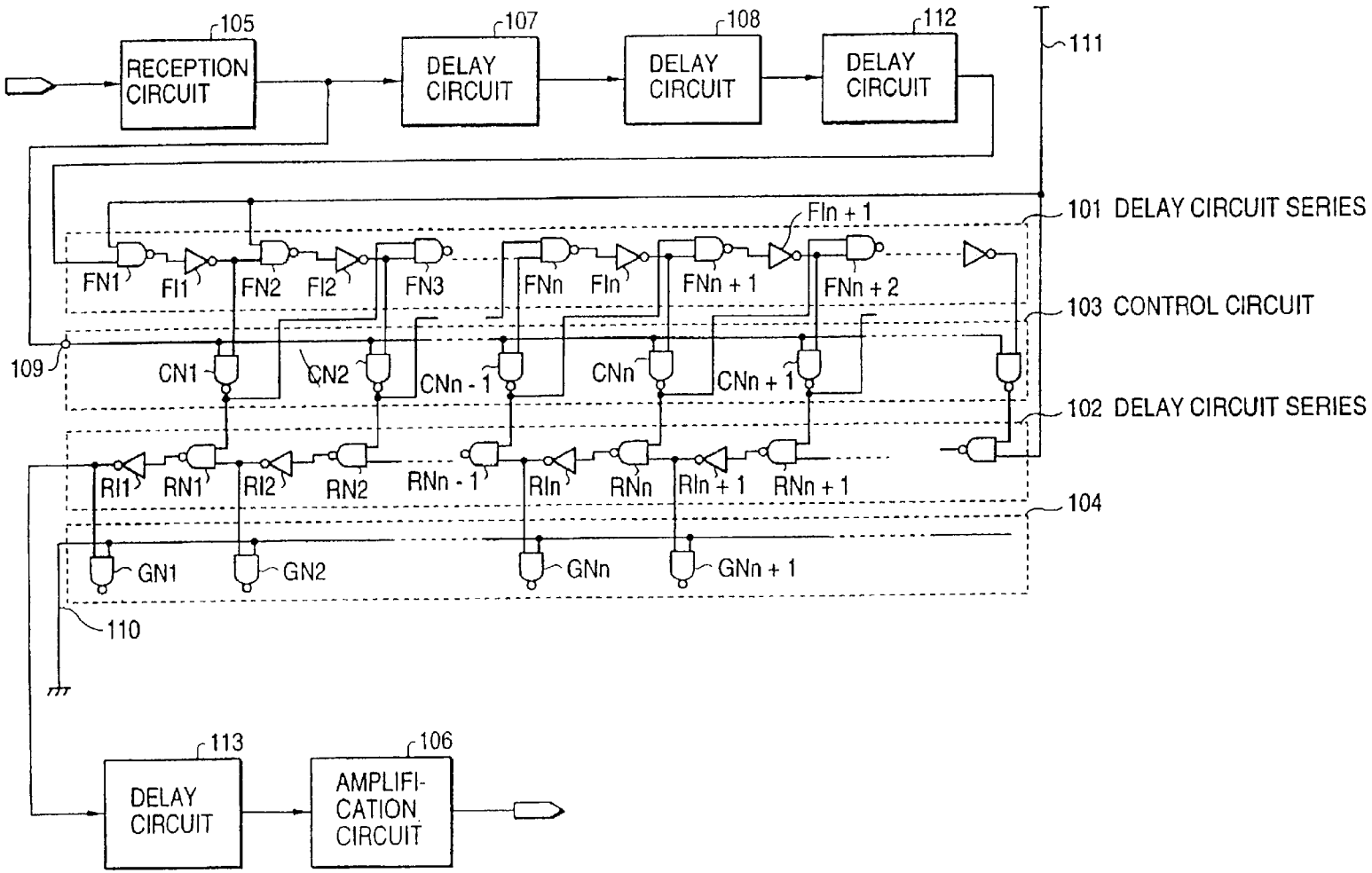
FIG. 7 is a circuit diagram showing the second embodiment of the delay circuit device of the present invention.

As shown in FIG. 7, this embodiment is configured by adding to the delay circuit device of FIG. 5 a delay circuit 112 that allows selection of a plurality of delay times according to a plurality of control signals, and a delay circuit 113 having equivalent composition delay circuit 112, delay circuit 112 being arranged in a series with the input path of delay circuit series 101, delay circuit 113 being arranged in a series with the output path of delay circuit series 102, and the delay times of delay circuit 112 and delay circuit 113 being controlled so as to be equal.

The operation of this embodiment will next be explained.

The operation of this embodiment is basically equivalent to that of the first embodiment with the difference that the regulation of the delay time dV of delay circuit 112 and delay circuit 113 has been added. Explanation will therefore first be given regarding delay time. As explained hereinabove, the delay times of reception circuit 105 and delay circuit 107 are equal and identified as d1. Also as described hereinabove, the delay times of amplification circuit 106 and delay circuit 108 are equal and identified as d2, the delay times of delay circuit 112 and delay circuit 113 are dV, and the cycle of the clock is tCK. Accordingly, the time for the leading edge of a clock to progress through delay circuit series 101 is delay time d1 of delay circuit 107, delay time d2 of delay circuit 108, and delay time dV of delay circuit series 112 subtracted from the clock cycle tCK, or tCK−d1−d2−dV. The delay circuits of delay circuit series 102 through which progresses the leading edge of an L pulse of the clock have the same number of constituent sections as the delay circuits of delay circuit series 101 through which progresses the leading edge of the clock, and therefore, the time required for the leading edge of the L pulse of the clock to progress through delay circuit series 102 is equal to the time required for the leading edge of the clock to progress through delay circuit series 101, this time being delay time d1 of delay circuit 117, delay time d2 of delay circuit 108, and delay time dV of delay circuit 113 subtracted from the clock cycle tCK, or tCK−d1−d2−dV.

As explained hereinabove, the time for passage of a clock through delay circuit series 101 and delay circuit series 102 includes the term of delay time of delay circuit 112 and delay circuit 113. Accordingly, dV can be set long if it is known in advance that the clock cycle tCK will be long, or dV can be set short if it is known in advance that the clock cycle tCK will be short.

From the above-described operation, it can be seen that with the present embodiment, desired characteristics can be obtained for a wide range of frequencies without greatly enlarging the scale of delay circuit series 101 and delay circuit series 102.

The Third Embodiment

The third embodiment of the present invention will next be explained with reference to FIG. 8.

Figure 8:
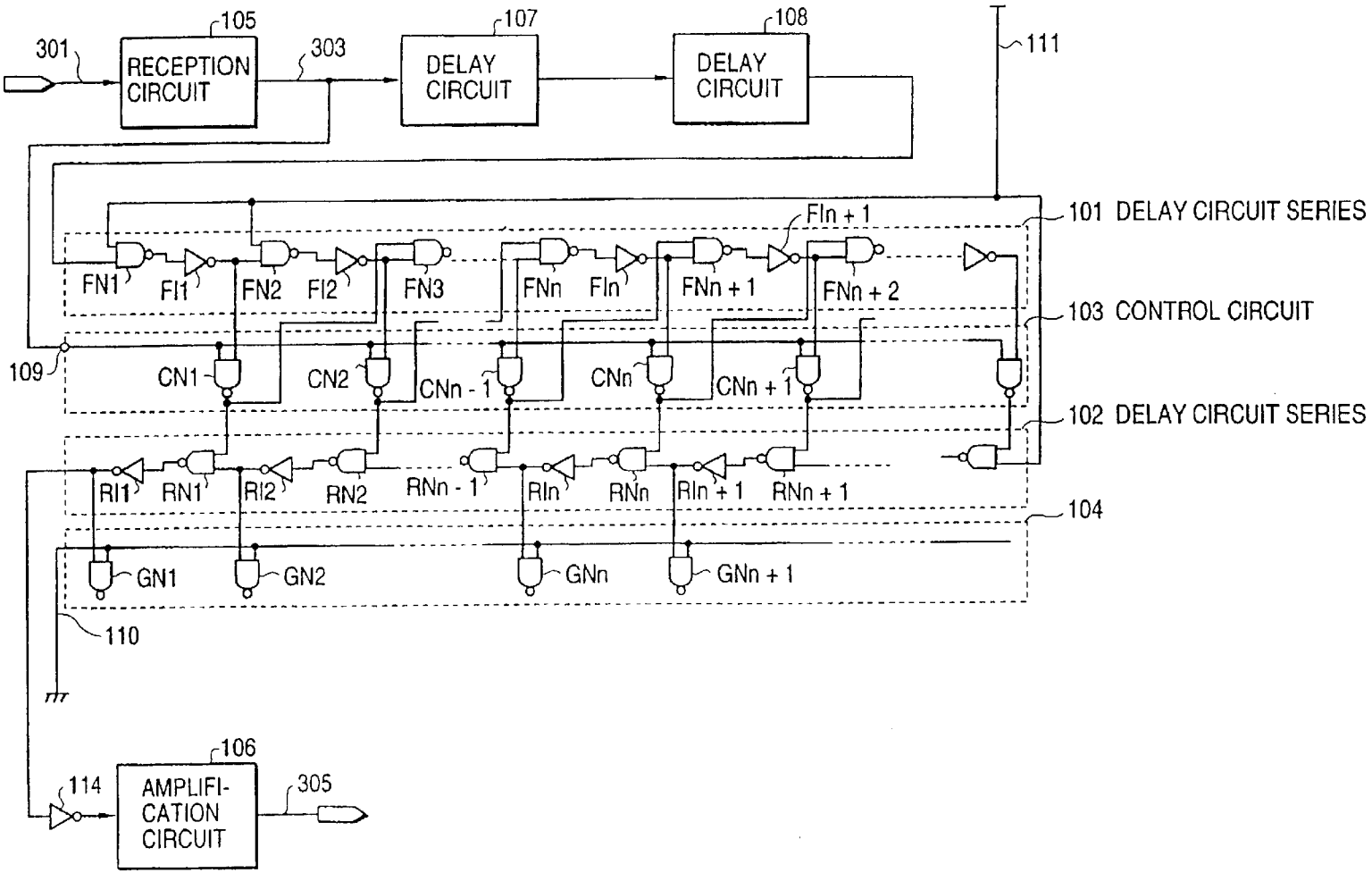
FIG. 8 is a circuit diagram showing the third embodiment of the delay circuit device of the present invention.

As shown in FIG. 8, this embodiment involves adding to the delay circuit device of FIG. 5 an inverter 114 that inverts input of amplification circuit 106, the embodiment differing from the first embodiment in that sum of the delay times of delay circuit 107 and delay circuit 108 is set to a time that is shorter than the sum of the delay time of reception circuit 105 and the delay time of amplification circuit 106 by the pulse width of clock 301.

The operation of this embodiment is basically equivalent to that of the first embodiment. However, while an H pulse is inverted to an L pulse when a pulse is transmitted from delay circuit series delay circuit series 102 in the first embodiment, in this embodiment, the L pulse is reinverted to an H pulse and outputted. Because the present embodiment also employs the leading edge of the outputted H pulse, regulation of the pulse width tPW is required.

Next will be explained the delay time distribution and output pulse timing. The sum of the delay times of delay circuit 107 and delay circuit 108 is a time shorter than the sum of the delay time of reception circuit 105 and the delay time of amplification circuit 106 by the pulse width tPW of inputted clock 301, or d1+d2−tPW. Accordingly, the time for the leading edge of a clock to progress through delay circuit series 101 is the sum of the delay time of delay circuit 107 and the delay time of delay circuit 108 d1+d2−tPW subtracted from the clock cycle tCK, or tCK−d1−d2+tPW. The delay circuits of delay circuit series 102 through which the leading edge of the L pulse of the clock progresses have the same number of constituent sections as the delay circuits of the delay circuit series 101 through which the leading edge of the clock progresses, and therefore, the time for the leading edge of the L pulse of the clock to progress through delay circuit series 102 is equal to the time for the leading edge of the clock to progress through delay circuit series 101, this time being d1+d2−tPW subtracted from the clock cycle tCK, or tCK−d1−d2+tPW. In addition, the time for the trailing edge of the L pulse of the clock to progress through delay circuit series 102 is shorter than the time for the leading edge by the pulse width tPW, or tCK−d1−d2.

As explained hereinabove, the time for passage of a clock through delay circuit series 101 and delay circuit series 102 includes the term of delay time of delay circuit 112 and delay circuit 113. Accordingly, dV can be set long if it is known in advance that the clock cycle tCK will be long, or dV can be set short if it is known in advance that the clock cycle tCK will be short.

From the above-described operation, it can be seen that with the present embodiment, desired characteristics can be obtained for a wide range of frequencies without greatly enlarging the scale of delay circuit series 101 and delay circuit series 102.

The Fourth Embodiment

The fourth embodiment of the present invention will next be explained with reference to FIGS. 9 and 10.

Figure 9:
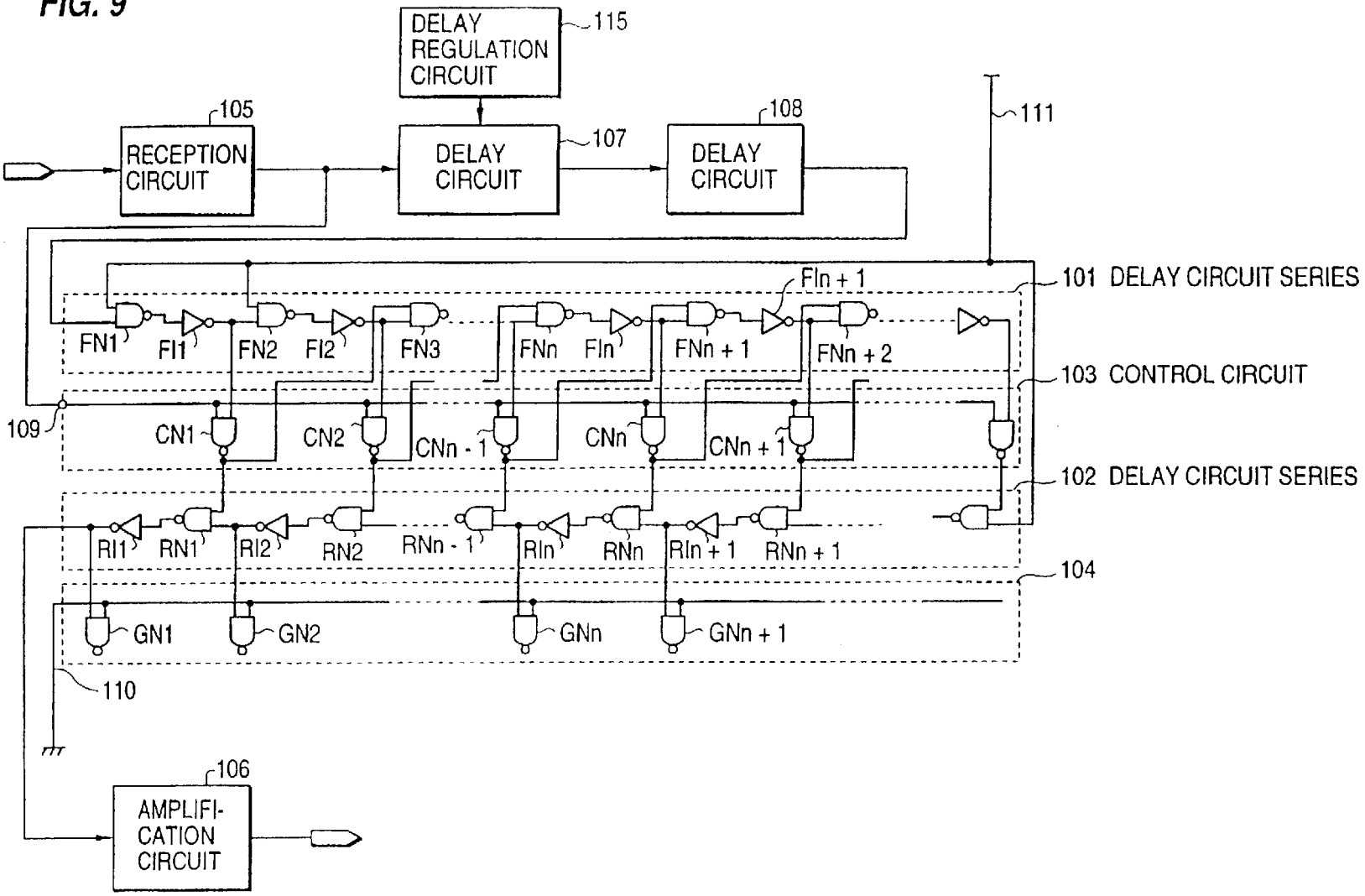
FIG. 9 is a circuit diagram showing the fourth embodiment of the delay circuit device of the present invention.

As shown in FIG. 9, this embodiment involves the addition of a delay regulation circuit 115 to the delay circuit device of FIG. 5, and delay circuit 107, instead of being a simple delay circuit, is a variable delay circuit allowing regulation by means of delay regulation circuit 115.

Figure 10:
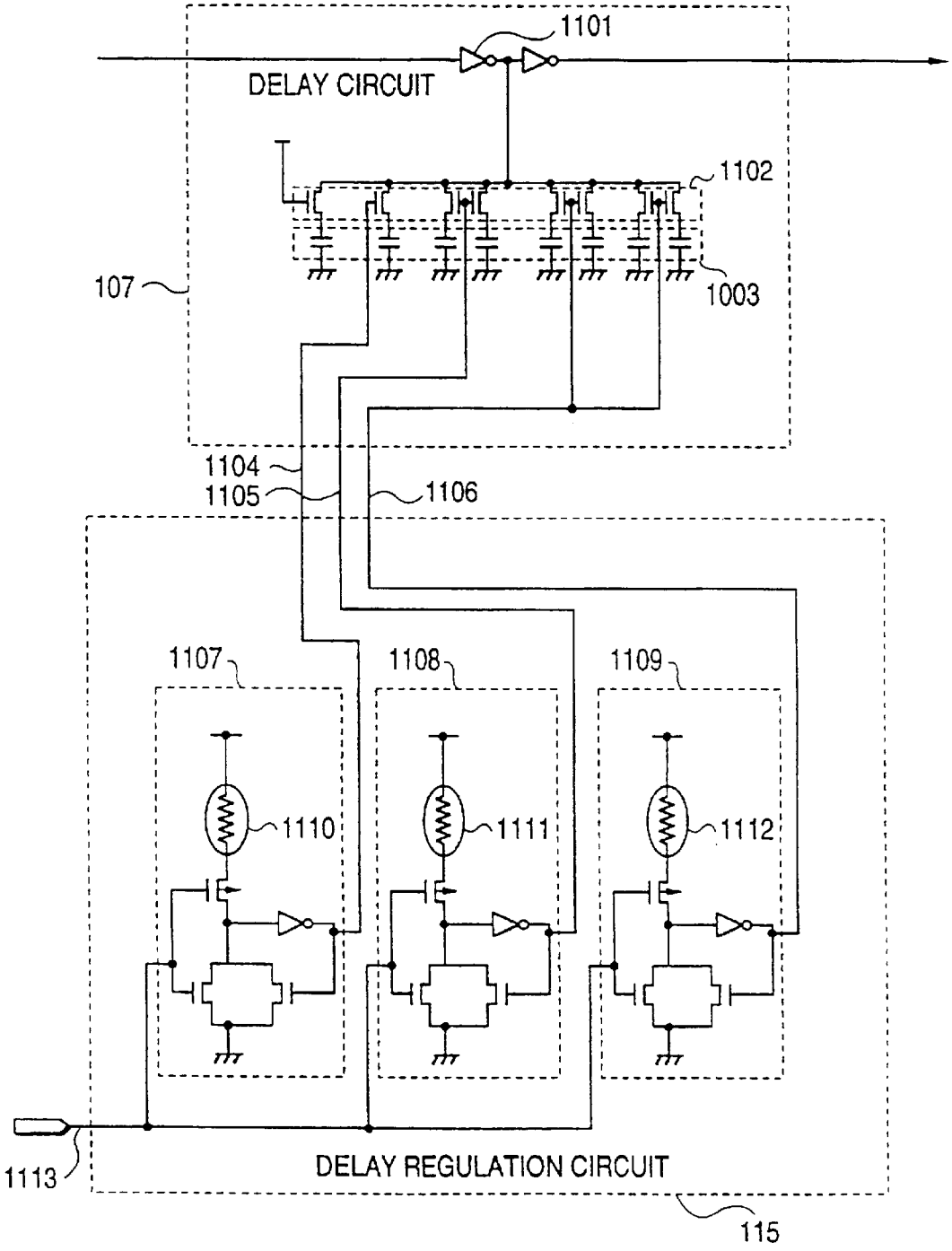
FIG. 10 is a circuit diagram showing delay circuit 107 and delay regulation circuit 115 of the fourth embodiment.

As shown in FIG. 10, in this embodiment, delay circuit 107 is configured with eight combinations of capacitance elements 1103 and transistors 1102, the capacitance elements 1103 being connected to the node of inverter series 1101 by way of transistors 1102. One of transistors 1102 is always in a conductive state, and of the other transistors, one is controlled by signal 1104, two are controlled by signal 1105, and four are controlled by signal 1106. The signals 1104, 1105, and 1106 are independently controlled by fuse register 1107, fuse register 1108, and fuse register 1109, respectively, within delay regulation circuit 115. As a result, the capacitance value connected to transistors 1102, has levels in 2 to the third power, i.e., 8 steps, and delay circuit 107 has delay times in eight steps. The output levels of fuse register 1107, fuse register 1108, and fuse register 1109 are determined by the connection states of fuse 1110, fuse 1111, and fuse 1112 and the set signal 1113.

In this embodiment, because delay times of delay circuit 107 can be regulated by fuses, clock timing can be set after completion of the semiconductor integrated circuit.

The Fifth Embodiment

Explanation will be presented regarding an embodiment for a case in which the present invention is employed for data output of a dynamic random access memory (hereinafter noted as DRAM) with reference to FIGS. 11–14.

Figure 11:
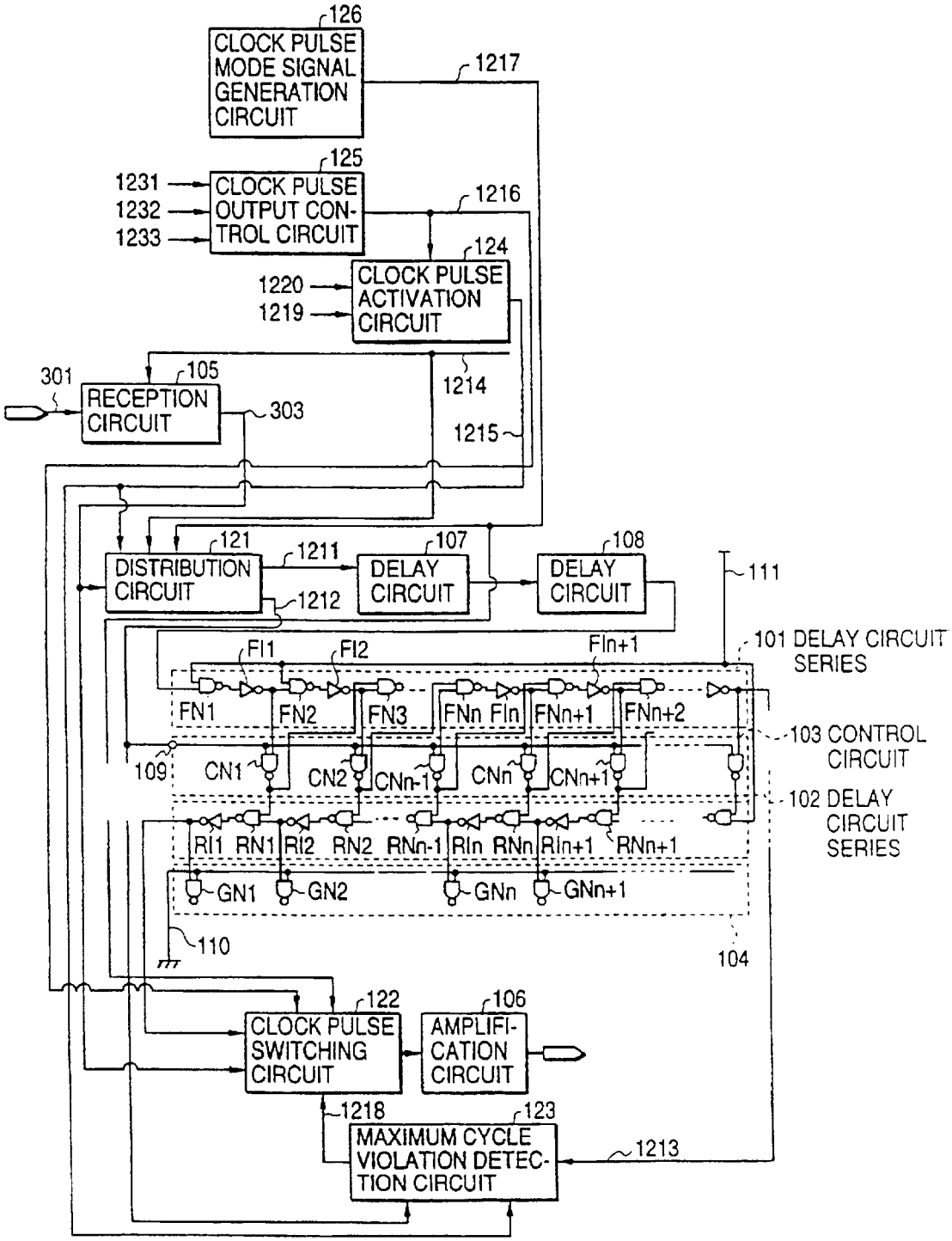
FIG. 11 is a circuit diagram showing the fifth embodiment of the delay circuit device of the present invention.

As shown in FIG. 11, the delay circuit device of this embodiment is configured by adding a distribution circuit 121, a clock pulse switching circuit 122, a maximum cycle violation detection circuit 123, a clock pulse activation circuit 124, a clock pulse output control circuit 125, and a clock pulse mode signal generation circuit 126 to the delay circuit device of FIG 5.

Distribution circuit 121 and clock pulse switching circuit 122 are circuits that divide or join a plurality of clock pulse paths, and these paths are controlled by a plurality of signals.

Maximum cycle violation detection circuit 123, clock pulse activation circuit 124, clock pulse output control circuit 125, and clock pulse mode signal generation circuit 126 are circuits that generate signals for controlling the clock pulse paths of distribution circuit 121 and clock pulse switching circuit 122, and moreover, are themselves controlled by control signals.

Distribution circuit 121 inputs the output of reception circuit 105 as clock pulse input, splits and outputs distribution circuit output 1211 and distribution circuit output 1212 as clock pulse output. Distribution circuit output 1211 is inputted to delay circuit 107 and distribution circuit output 1212 is inputted to control terminal 109 and maximum cycle violation detection circuit 1203.

The signals that control distribution circuit 121 are clock pulse activation signal 1214, clock pulse activation signal 1215, and clock pulse mode signal 1217.

Figure 12:
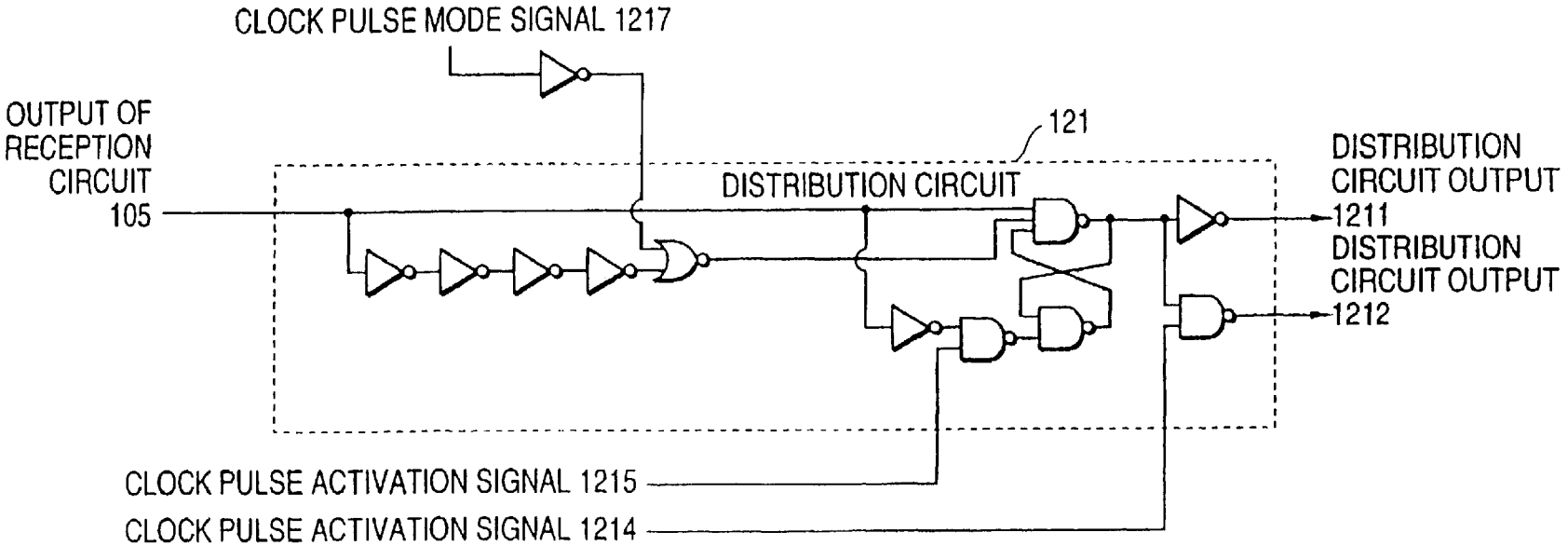
FIG. 12 is a circuit diagram showing distribution circuit 121 in the fifth embodiment.

FIG. 12 shows a circuit diagram of distribution circuit 121. As described hereinabove, the output of reception circuit 105 is a clock pulse output of an H pulse outputted at a fixed cycle. When clock pulse mode signal 1217 is H, the output of reception circuit 105 is directed through distribution circuit 121, and distribution circuit output 1211 and distribution circuit output 1212 are made clock pulse output. When clock pulse mode signal 1217 is H, the output of reception circuit 105 is not directed through distribution circuit 121, distribution circuit output 1211 is fixed at L, and distribution circuit output 1212 is fixed at L or H. When clock pulse activation signal 1214 is H, distribution circuit output 1212 is made an output equal to distribution circuit output 1211, and when clock pulse activation signal 1214 is L, distribution circuit output 1212 is fixed at H. The clock pulse of reception circuit 105 output inputted after clock pulse activation signal 1215 becomes H is directed through distribution circuit 121, and distribution circuit output 1211 and distribution circuit output 1212 are made the clock output. The clock pulse of reception circuit 105 output inputted after clock pulse activation signal 1215 becomes L is not directed through distribution circuit 121, and distribution circuit output 1211 is fixed at L and distribution circuit output 1212 is fixed at L or H. The clock of reception circuit 105 output is regulated to a pulse width of the width of delay of 4 inverter sections and 1 NOR section when passing through distribution circuit 121.

Clock switching circuit 122 is arranged between delay circuit series 102 and amplification circuit 106 and inputs the output of delay circuit series 102 and the output of reception circuit 105, and the output of clock switching circuit 122 is inputted to amplification circuit 106.

The signals that control clock pulse switching circuit 122 are clock pulse output control signal 1216, clock pulse mode so signal 1217, and clock pulse switching signal 1218.

Figure 13:
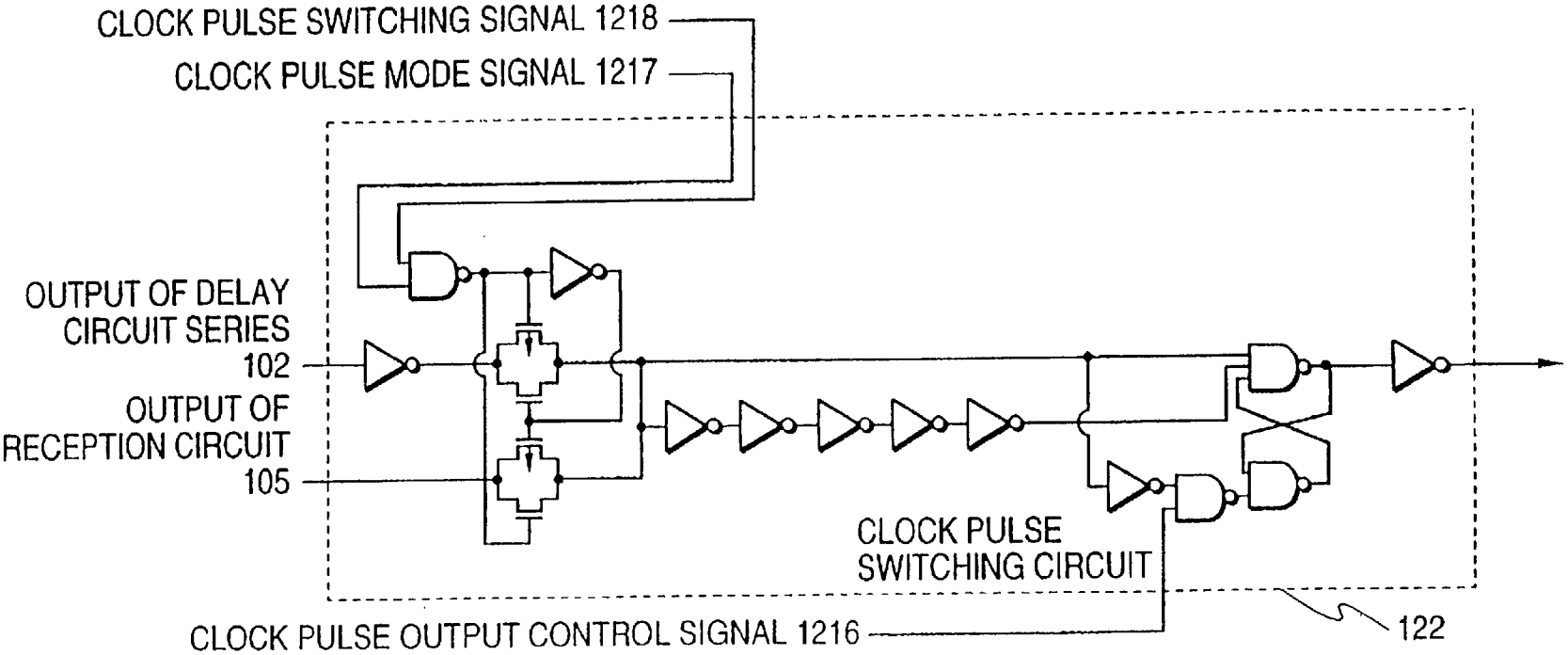
FIG. 13 is a circuit diagram showing clock switching circuit 122 in the fifth embodiment.

FIG. 13 shows a circuit diagram of clock switching circuit 122. The clock pulse output of reception circuit 105 or the clock pulse output of delay circuit series 102 inputted after clock pulse output control signal 1216 becomes H is directed through clock pulse switching circuit 122, and the output of clock pulse switching circuit 122 is made the H clock pulse output. The clock pulse output of reception circuit 105 or delay circuit series 102 inputted after clock pulse output control signal 1216 becomes L is not directed through clock pulse switching circuit 122, and the output of clock pulse switching circuit 122 is fixed at L. When clock pulse mode signal 1217 and clock pulse switching signal 1218 both become H, the output of delay circuit series 102 can be directed through clock pulse switching circuit 122, and when one or both of clock pulse mode signal 1217 and clock pulse switching signal 1218 become L, the output of reception circuit 105 can be directed through clock pulse switching circuit 122.

When a clock pulse that has progressed through delay circuit series 101 is inputted at a cycle longer than the time to reach the farthest end of delay circuit series 101, and a maximum cycle violation signal 1213 outputted as an H pulse enters maximum cycle violation detection circuit 123, the maximum cycle violation signal 1213 is taken in by the leading edge of the first H pulse of distribution circuit output 1212, and clock pulse switching signal 1218 is changed from a output to L output by the trailing edge of the following H pulse.

Once clock pulse switching signal 1218 becomes L output, it has a hysteresis to return to H output if maximum cycle violation signal 1213 continues as L output during the time three H pulses of distribution circuit output 1212 enter. Clock pulse switching circuit 122 allows the output of delay circuit series 102 to pass when clock switching signal 1218 is H output, and allows the output of reception circuit 105 to pass when clock switching signal 1218 is L output.

Maximum cycle violation detection circuit 123 is controlled by clock activation signal 1215. Distribution circuit output 1212 is employed when maximum cycle violation signal 1213 is taken in by RSF-F/F 1221, D-LAT 1222 and D-F/F 1223 (FIG. 14).

Figure 14:
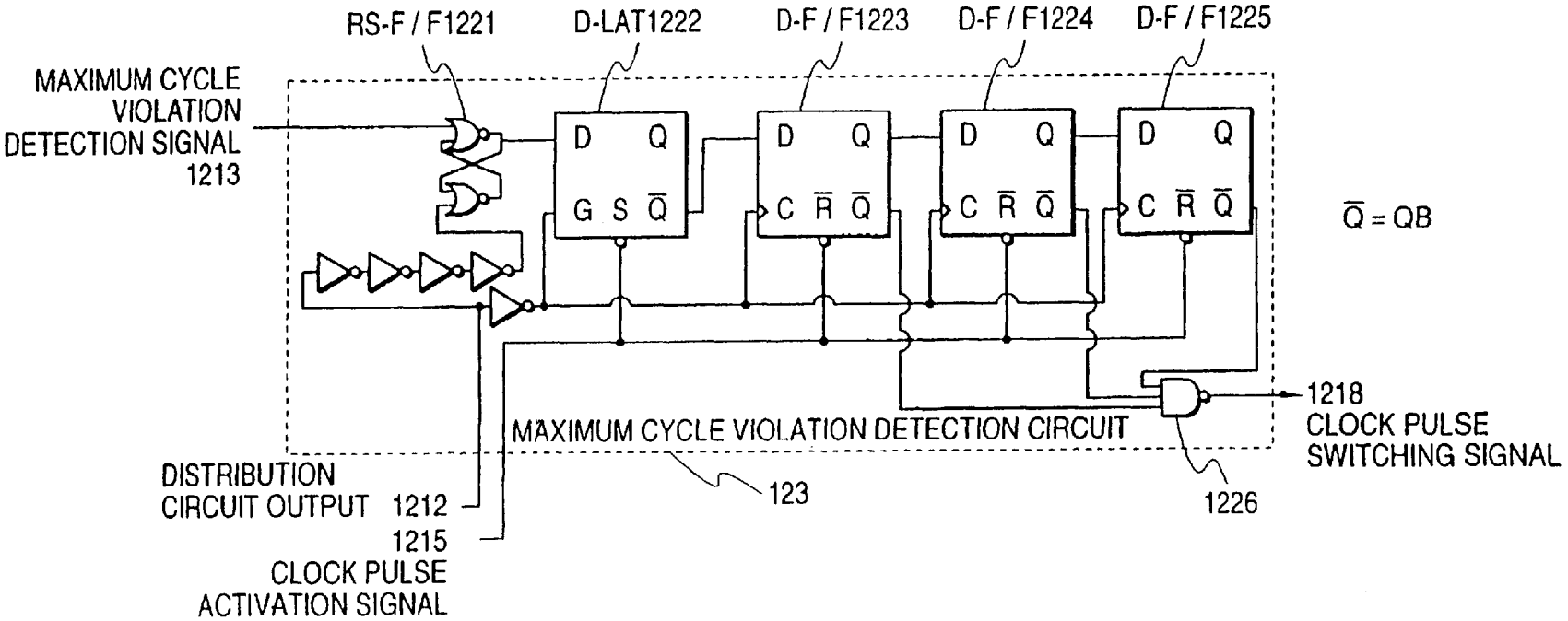
FIG. 14 is a circuit diagram showing maximum cycle violation detection circuit 123 in the fifth embodiment.

FIG. 14 shows a logic circuit diagram of maximum cycle violation detection circuit 123. When maximum cycle violation signal 1213 enters as an H pulse, the output of RS-F/F 1221 becomes L output until a signal in which delay is added to distribution circuit output 1212 next becomes H output. The L output of RS-F/F 1221 is first taken in by the leading edge by which distribution circuit output 1212 becomes H at D-LAT 1222, and is outputted as H output from QB of D-LAT 1222. The H output from QB of D-LAT 1222 is next taken in by the trailing edge by which distribution circuit output 1212 next changes from H to L at D-F/F 1223 and is outputted as H output from Q of D-F/F 1223. The H output from Q of D-F/F 1223 is taken in by the trailing edge by which distribution circuit output 1212 two stages later changes from H to L at D-F/F 1224, and is outputted as H output from Q of D-F/F 1224. The H output from Q of D-F/F 1224 is taken in by the trailing edge by which distribution circuit output 1212 changes from H to L two stages later at D-F/F 1225, and is outputted as H output from Q of D-F/F 1225. The QB output of D-F/F 1233, the QB output of D-F/F 1224, and the QB output of D-F/F 1225 are inputted to 3-input NAND 1226, and the output of 3-input NAND 1226 is outputted as the output clock switching signal 1218 of maximum cycle violation detection circuit 123.

During L output, clock pulse activation signal 1215 fixes the QB output of D-LAT 122 at L, fixes the QB output of D-F/F 1223 at H, fixes the QB output of D-F/F 1224 at H, fixes the QB output of D-F/F 1225 at H, and fixes the output clock pulse switching signal 1218 of maximum cycle violation detection circuit 123 at H. In addition, during L output, clock pulse activation signal 1215 fixes distribution circuit output 1212 at H, and at this time, the output of RS-F/F 1221 is fixed at H.

Clock pulse activation circuit 124 inputs active signal 1219 and power down signal 1220, and outputs clock pulse activation signal 1214 and clock pulse activation signal 1215. Clock pulse activation circuit 124 is controlled by clock pulse output control signal 1216.

Figure 15:
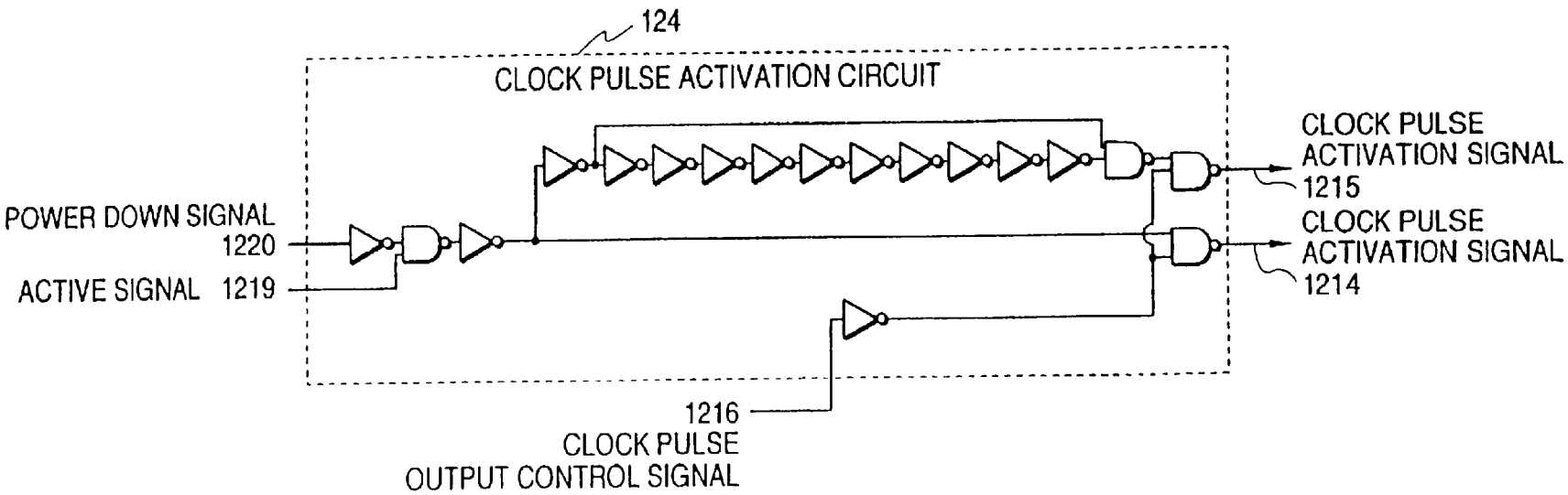
FIG. 15 is a circuit diagram showing clock activation circuit 124 in the fifth embodiment.

FIG. 15 is a circuit diagram showing clock activation circuit 124.

Clock pulse activation circuit 124 makes clock pulse activation signal 1214 H output when active signal 1219 outputs L, and after a set time interval, makes clock pulse activation signal 1215 H output. When active signal 1219 outputs at H, clock pulse activation signal 1214 is made L output, and at approximately the same time, makes clock pulse activation signal 1215 L output. When power down signal 1220 outputs at H, clock pulse activation signal 1214 is made L output, and after a set time interval, clock pulse activation signal 1215 is made L output. When power down signal 1220 outputs at L, clock pulse activation signal 1214 is made L output, and at approximately the same time, clock pulse activation signal 1215 is made L output. In addition, when clock pulse output control signal 1216 is at H, clock pulse activation signal 1214 is made H output, and clock pulse activation signal 1215 is made H output.

When clock pulse activation signal 1214 becomes H, reception circuit 105 is activated, and distribution circuit output 1212 is changed from a fixed H to a state allowing clock output. When clock activation signal 1214 becomes L, reception circuit 105 is halted, and distribution circuit output 1212 is fixed at H. When distribution circuit output 1212 is fixed at H, all H pulses progressing through delay circuit series 101 are transferred to delay circuit series 102, and all H pulses within delay circuit series 101 are fixed at L.

When clock pulse activation signal 1214 is made H, and after a fixed time interval clock pulse activation signal 1214 is made L, reception circuit is activated and after a state is reached in which a complete pulse can be outputted, places the output of reception circuit 105 in a state that allows passage through distribution circuit 121, and moreover, changes the clock pulse switching signal 1218 of the output of maximum cycle violation detection circuit 123 from a fixed H to a state that enables L output of clock pulse switching signal 1218 synchronized with distribution circuit output 1212 when maximum cycle violation signal 1213 enters.

Clock pulse mode signal generation circuit 126 outputs clock mode signal 1217. Clock pulse mode signal 1217 is inputted to distribution circuit 121 and clock pulse switching circuit 122. During H output of clock pulse mode signal 1217, the clock pulse of output of reception circuit 105 passes through distribution circuit 121, and is able to pass through delay circuit 107, delay circuit 108, delay circuit series 101, and delay circuit series 102. During L output of clock pulse mode signal 1217, the clock pulse of output of reception circuit 105 passes through distribution circuit 121, but is unable to pass through delay circuit 107, delay circuit 108, delay circuit series 101, and delay circuit series 102.

Clock pulse output control circuit 125 outputs clock pulse output control signal 1216 in accordance with read mode signal 1231, burst mode signal 1232, and CAS latency signal 1233. Read mode signal 1231 is a signal that directs DRAM to enter a data read cycle, and is inputted from the exterior a fixed time interval after active signal 1219 becomes H. This fixed time interval must be longer than the time interval clock pulse activation signal 1214 is H outputted and clock pulse activation signal 1215 is H outputted. Burst mode signal 1232 is a signal indicating the number of clock pulses for continuously outputting data when DRAM is in a data read cycle. CAS latency signal 1233 is a signal indicating the number of clocks pulses from entrance of read mode signal 1231 until data is outputted. Burst mode signal 1232 and CAS latency signal 1233 are both preset signals.

After read mode signal 1231 becomes H, clock pulse output control signal 1216 is H outputted for the interval of the number of clock pulses indicated by burst mode signal 1232 added to the number of clock pulses indicated by CAS latency signal 1233.

In the present embodiment, in a case in which the clock frequency becomes long and a clock pulse is not transferred to delay circuit series 102 even though a clock pulse has reached the farthest end of delay circuit series 101, a situation in which clock pulses are not supplied to internal circuits can be avoided by inputting the output of reception circuit 105 to amplification circuit 106, and moreover, frequent changes in the output timing of clock pulses can be avoided by providing a hysteresis in the clock pulse switching. In addition, by activating clock pulses according to DRAM operation, clock pulses can be halted except when necessary and power consumption reduced, and moreover, by shifting the activation timing of received external clock pulses and the activation timing of internal clock pulses, the occurrence of hazards can be suppressed. Finally, when clock pulses are halted, H pulses within delay circuit series 101 are all transferred to delay circuit series 102 and pulses within delay circuit series 101 are fixed at L, thereby eliminating unnecessary operation in delay circuit series 101 and delay circuit series 102.

The Sixth Embodiment

Next will be explained the sixth embodiment of the present invention.

Figure 16:
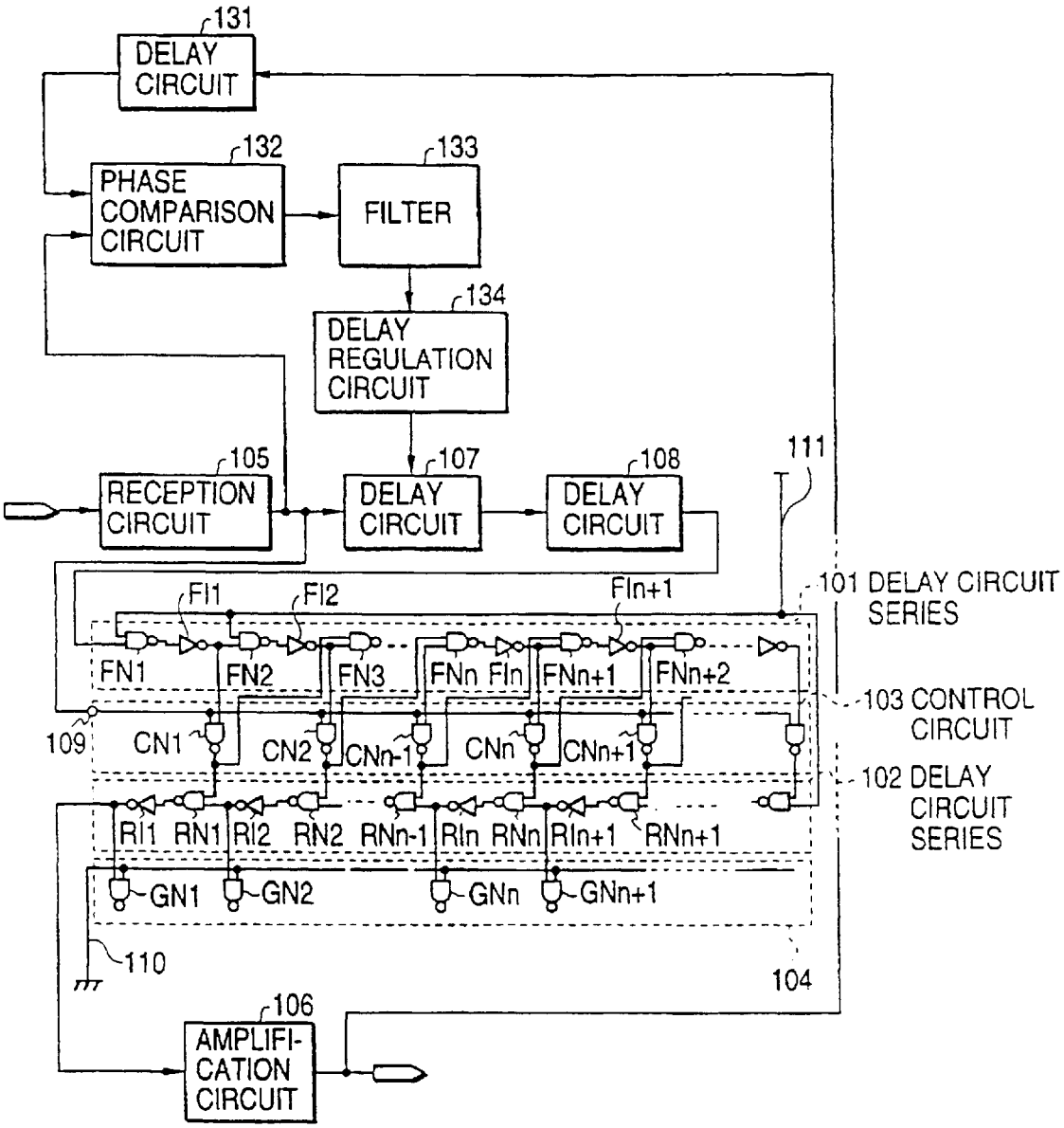
FIG. 16 is a circuit diagram showing the sixth embodiment of the delay circuit device of the present invention.

As shown in FIG. 16, the present embodiment is configured by the addition of a delay circuit 131, a phase comparison circuit 132, a filter 133, and a delay regulation circuit 134 to the delay circuit device of FIG. 5.

Delay circuit 131 is set to a delay time equal to that of reception circuit 105, delay circuit 107 is not a simple delay circuit but variable delay circuit that allows regulation through delay regulation circuit 134. The output of amplification circuit 106 is inputted to delay circuit 131, and the output of delay circuit 131 is inputted to phase comparison circuit 132. Phase comparison circuit 132 inputs the output of reception circuit 105. From phase comparison circuit 132 a signal is outputted according to the phase difference of the output of delay circuit 131 and the output of regulation circuit 105, and this signal is inputted to delay regulation circuit 134 by way of filter 133. The output of delay regulation circuit 134 is inputted to delay circuit 107 and this output regulates the delay time of delay circuit 107 so as to eliminate the phase difference between the output of delay circuit 131 and the output of reception circuit 105.

Figure 17:
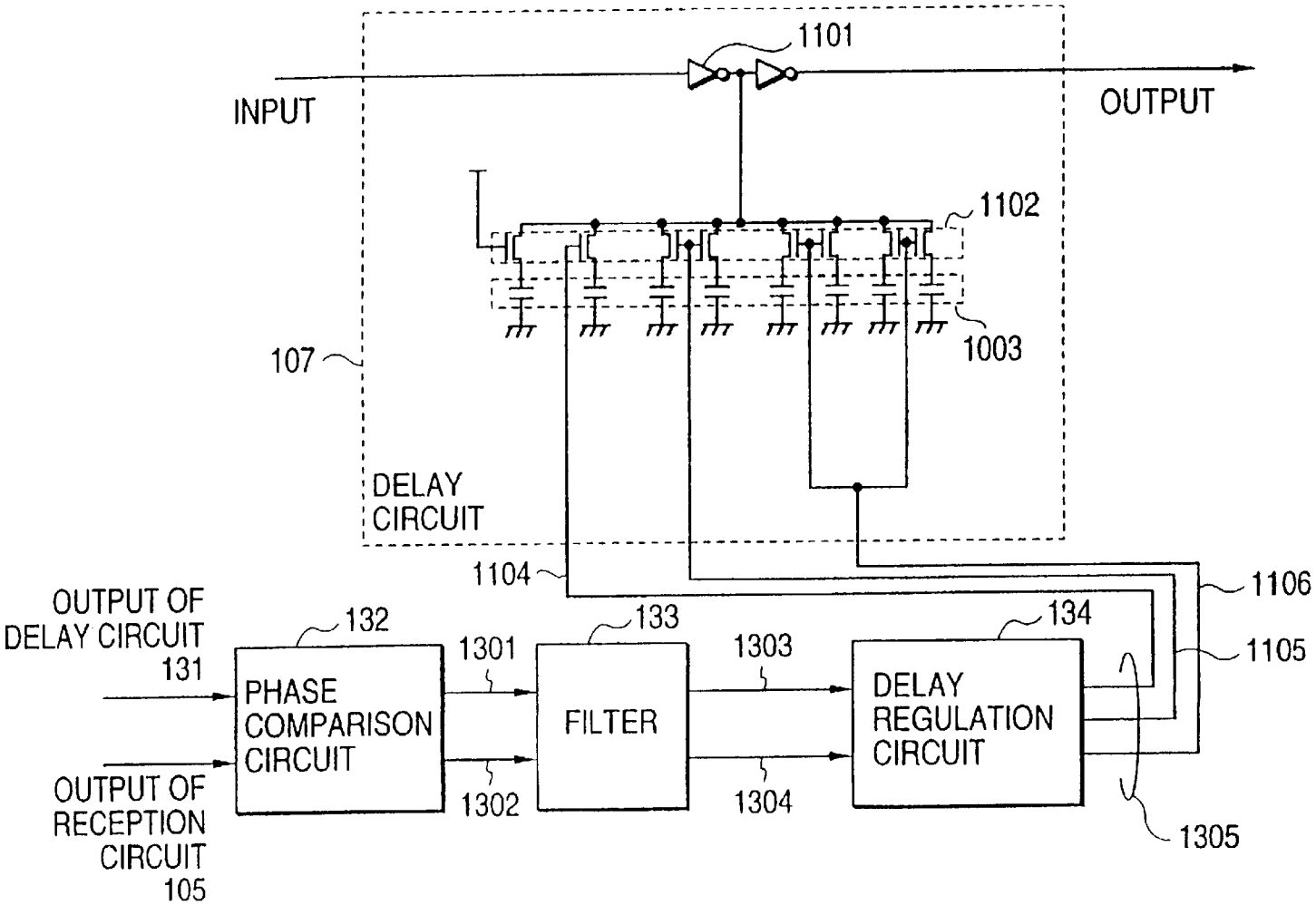
FIG. 17 a circuit diagram showing the circuit from phase comparison circuit 132 to delay regulation circuit 134 of the sixth embodiment.

FIG. 17 is shows a circuit diagram of the present embodiment from phase comparison circuit 132, filter 133, delay regulation circuit 134 up to delay circuit 107.

In the present embodiment, delay circuit 107 has the same configuration as that of the fourth embodiment with eight combinations of capacitance elements 1103 and transistors 1102, the capacitance elements 1103 being connected to the node of inverter series 1101 by way of transistors 1102. One of transistors 1102 is always in a conductive state, and of the other transistors, one is controlled by signal 1104, two are controlled by signal 1105, and four are controlled by signal 1106. Each of signals 1104, 1105, and 1106 are in turn controlled by three-bit counter within delay regulation circuit 134. Accordingly, the capacitance value connected to transistors 1102 has levels in 2 to the third power, i.e., 8 steps, and delay circuit 107 has delay times in eight steps. The three-bit counter in delay regulation circuit 134 is controlled by count-up signal 1308 and count-down signal 1309 outputted from filter 133. Filter 133 is controlled by up signal 1306 and down signal 1307 outputted from phase comparison circuit 132.

In the present embodiment, filter 133 has an N before M filter configuration wherein N=4 and M=6. Phase comparison circuit 132 is composed of NANDs and outputs a down signal 1302 when the phase of output of delay circuit 131 is ahead of the output of reception circuit 105 and an up signal 1301 when the phase of output of delay circuit 131 is behind. Delay circuit 107 has delay times in eight steps such that the added delay times of NAND FNn and inverter FIn of delay circuit series 101 is divided into eight equal time intervals. In the present embodiment, the added delay times of NAND FNn and inverter FIn of delay circuit series 101 is 0.4 nanoseconds, and the unit of the eight steps of delay times of delay circuit is 0.05 nanoseconds.

According to the present element, a clock pulse having a smaller phase difference between an external clock pulse and internal clock pulse can be provided in relatively less time. In addition, because phase difference is nearly eliminated in advance through delay circuit series 101 and delay circuit series 102, as a circuit employing phase comparison circuit 132, allows control of clock pulses over a wide range of frequencies. Furthermore, although digital circuits were employed in filter 133 and delay regulation circuit 134 of the present embodiment, the circuits may also be constructed as analog circuits composed of capacitance and resistance.

The Seventh Embodiment

The seventh embodiment of the present invention will next be explained with reference to FIGS. 18 and 19.

Figure 18:
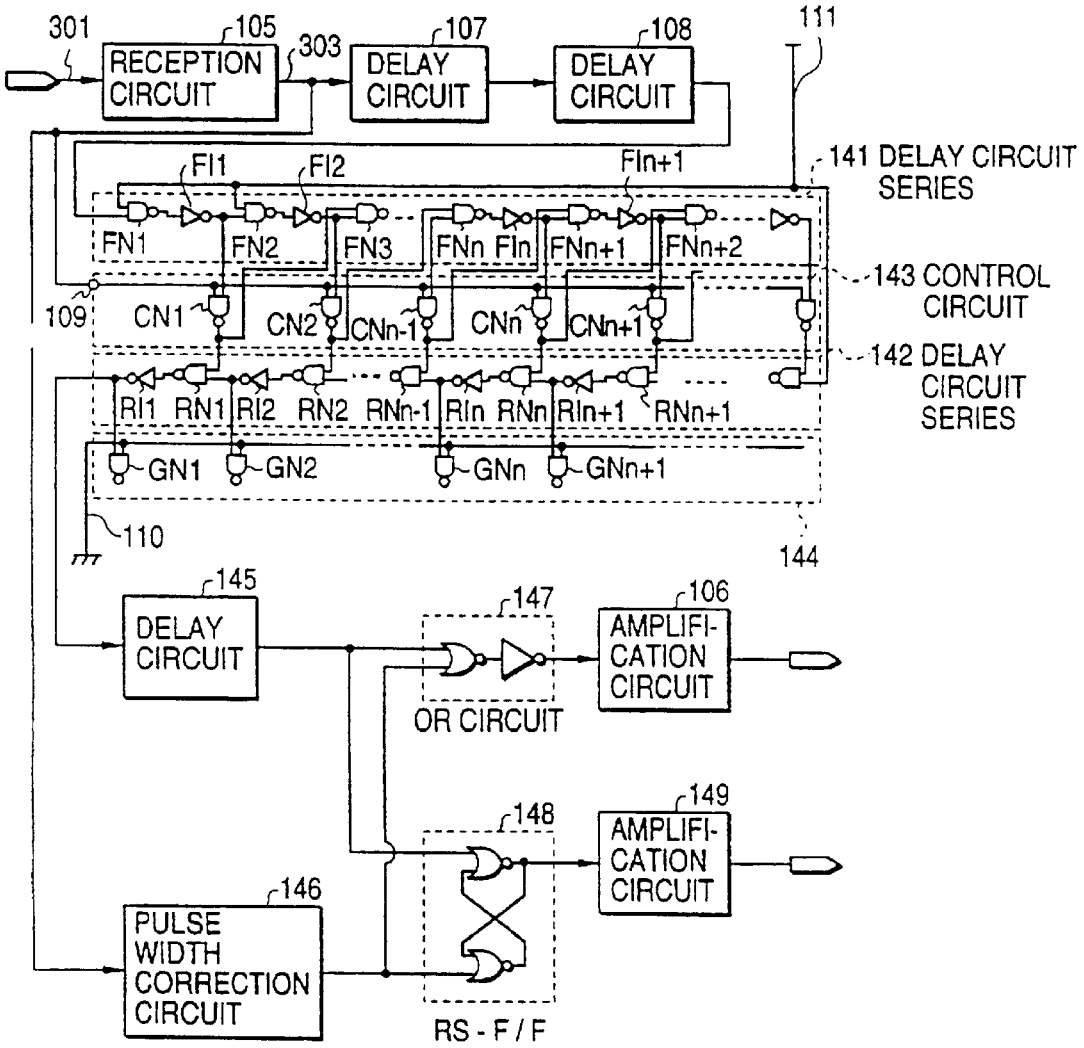
FIG. 18 is a circuit diagram showing the seventh embodiment of the delay circuit device of the present invention.
Figure 19:
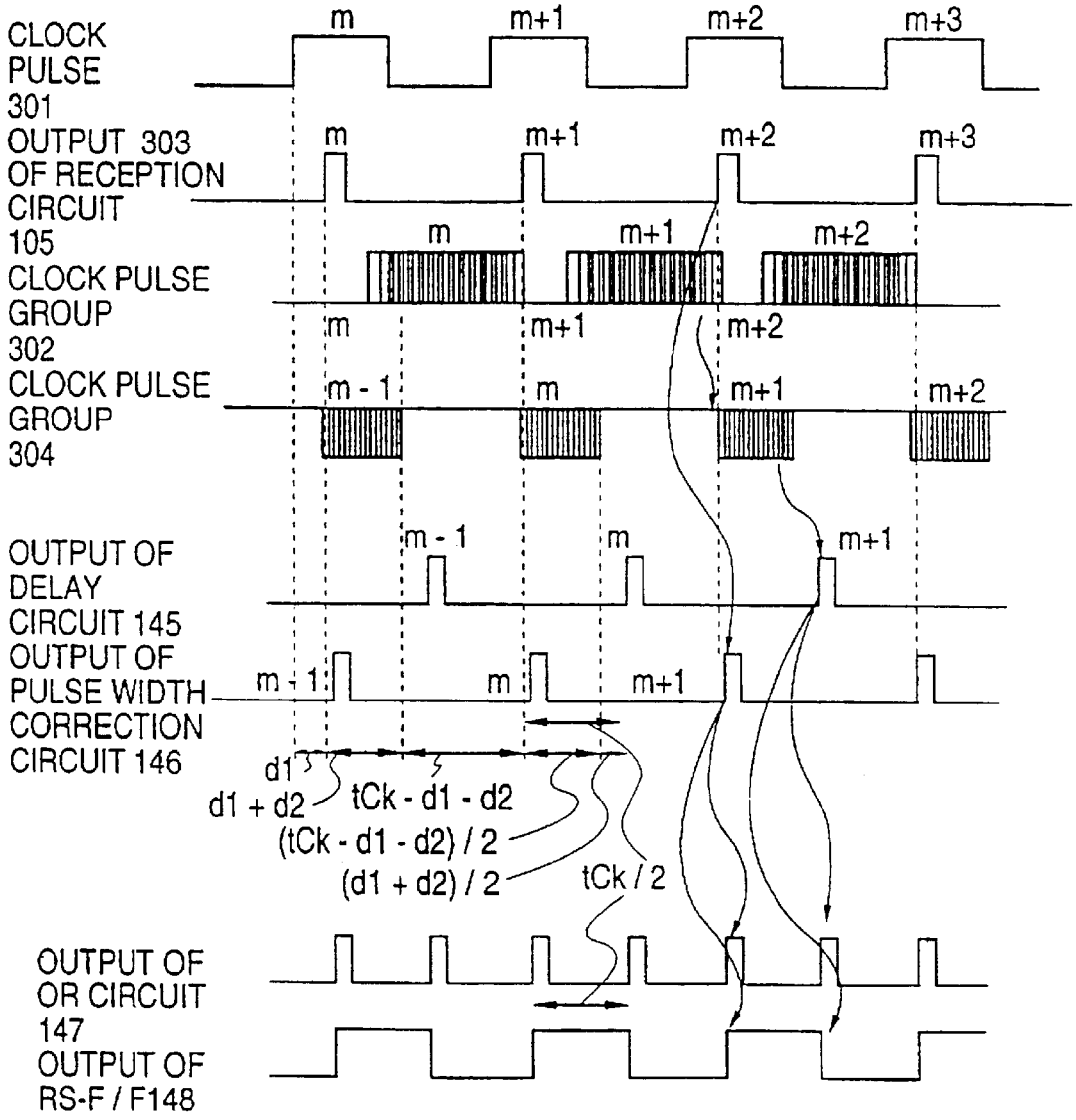
FIG. 19 is a waveform chart illustrating the operation of the seventh embodiment.

Referring to FIG. 18, the present embodiment is nearly the same as the circuit shown in FIG. 5, with the exceptions that delay circuit series 101 is replaced by delay circuit series 141, delay circuit series 102 is replaced by delay circuit series 142, control circuit 103 is replaced by control circuit 143, load regulation element 104 is replaced by load regulation element 144, delay circuit 145 and OR circuit 147 are arranged between delay circuit series 142 and amplification circuit 106, and in addition. RS-F/F 148, pulse width correction circuit 146, and amplification circuit 149 are also incorporated.

Delay circuit series 142 is composed of half of the elements of delay circuit series 141 or the delay circuit series 102 of FIG. 5. Every other unit, i.e., half of the output of delay circuit series 141 is connected to the input of delay circuit series 142 by way of control circuit 143. Because delay circuit series 142 is composed of half as many elements as delay circuit series 141 or delay circuit series 102 of FIG. 5, the delay time is half that of delay circuit series 141 or delay circuit series 102. In addition, the pulse width of a pulse transmitted from delay circuit series 141 is reduced by ½.

Delay circuit 145 has a delay time (d1+d2)/2+tPW/2, which is half of delay time d1 of delay circuit 107 added to delay time d2 of delay circuit 108, or (d1+d2)/2, to which is added half of the time of the pulse width tPW of the output of reception circuit 105, or tPW/2. As in the third embodiment, the present embodiment employs output of delay circuit series 142 that has been inverted, and therefore, one half of the time of the pulse width tPW of the output of reception circuit 105, i.e., tPW/2, is added to the delay time for timing correction.

Pulse width correction circuit 146 halves the pulse width of reception circuit 105.

OR circuit 147 combines the output of delay circuit 145 with the output of pulse width correction circuit 146. RS-F/F 148 outputs a pulse having a pulse width from the leading edge of the output of pulse width correction circuit 146 to the leading edge of the output of delay circuit 145.

The operation of the present embodiment will next be explained with reference to FIG. 19.

H clock pulse 301 inputted to reception circuit 105 is regulated to pulse width tPW at reception circuit 105 and outputted after an interval of d1, passes through delay circuit 107 and delay circuit 108 in a time interval d1+d2, is inputted to delay circuit series 141, and continues to progress through delay circuit series 141 until the following clock pulse of the output of reception circuit 105 is inputted to control circuit 103. The time for the H clock pulse to progress through delay circuit series 141 is the time of (d1+d2) subtracted from the clock cycle tCK, i.e., tCK−(d1+d2) in the case of the leading edge, and the time of (d1+d2) and pulse width tPW subtracted from the clock cycle tCK, i.e., tCK−(d1+d2)−tPW in the case of the trailing edge. When the following clock pulse of the reception circuit 105 output is inputted to control circuit 143, the H clock pulse is transmitted to delay circuit series 142 and becomes an L clock pulse.

The leading edge of the L clock pulse progressing though delay circuit series 142 takes half the time tCK−(d1+d2) for progression through delay circuit series 141, i.e., {tCK−(d1+d2)}/2. The trailing edge of the L clock pulse progressing through delay circuit series 142 takes half the time tCK−(d1+d2)−tPW for progression through delay circuit series 141, i.e., {tCK−(d1+d2)−tPW}/2.

The L pulse leaving delay circuit series 142 is inverted in delay circuit 145 to become an H pulse. The delay time of delay circuit series 142 is (d1+d2)/2+tPW/2. Accordingly, the time necessary from the time of transmission from delay circuit series 141 to delay circuit series 142 until the time of exiting from delay circuit 145 is tCK/2, or the time {tCK−(d1+d2)−tPW}/2 for progression through delay circuit series 141 as the leading edge of L clock pulse progressing through delay circuit series 142 added to the time (d1+d2)/2+tPW/2 for inversion and progression through delay circuit 145.

On the other hand, the delay time of pulse width correction circuit 146 is small and set such that the delay time difference with delay circuit 145 is tCK/2. As a result, the output of OR circuit 147 is the combined clock pulse of the output of delay circuit 145 and the output of pulse width correction circuit 146, which is a clock pulse having a cycle twice as great as that of reception circuit 105. The output of OR circuit 147 is amplified to the desired drive capacity by amplification circuit 106.

The output of RS-F/F 148 is a pulse having pulse width from the leading edge of the output of pulse width correction circuit 146 to the leading edge of the output of delay circuit 145, and in this case, the pulse width is exactly one half that of the clock pulse cycle. The output of RS-F/F 148 is amplified to the desired drive capacity at amplification circuit 149.

Otherwise, the output of delay circuit series 142 is amplified as is and outputted, and can be used as a clock pulse having timing of one half the cycle of an external clock.

As explained hereinabove, the present embodiment allows generation of a clock pulse having double the cycles with a duty cycle of 50% after one clock pulse in contrast to the several tens of cycles to several ten thousand cycles required in conventional PLL. In addition, a combination with the circuits of the first to sixth embodiments allows the generation of a double cycle clock pulse having no phase difference or delay difference with an external clock pulse or the generation of a clock pulse having a duty cycle of 50%. In addition, combining a plurality of these embodiments enables the generation of a clock pulse of four times or eight times the cycles.

The Eighth Embodiment

The eighth embodiment of the present invention will next be explained with reference to FIG. 20.

Figure 20:
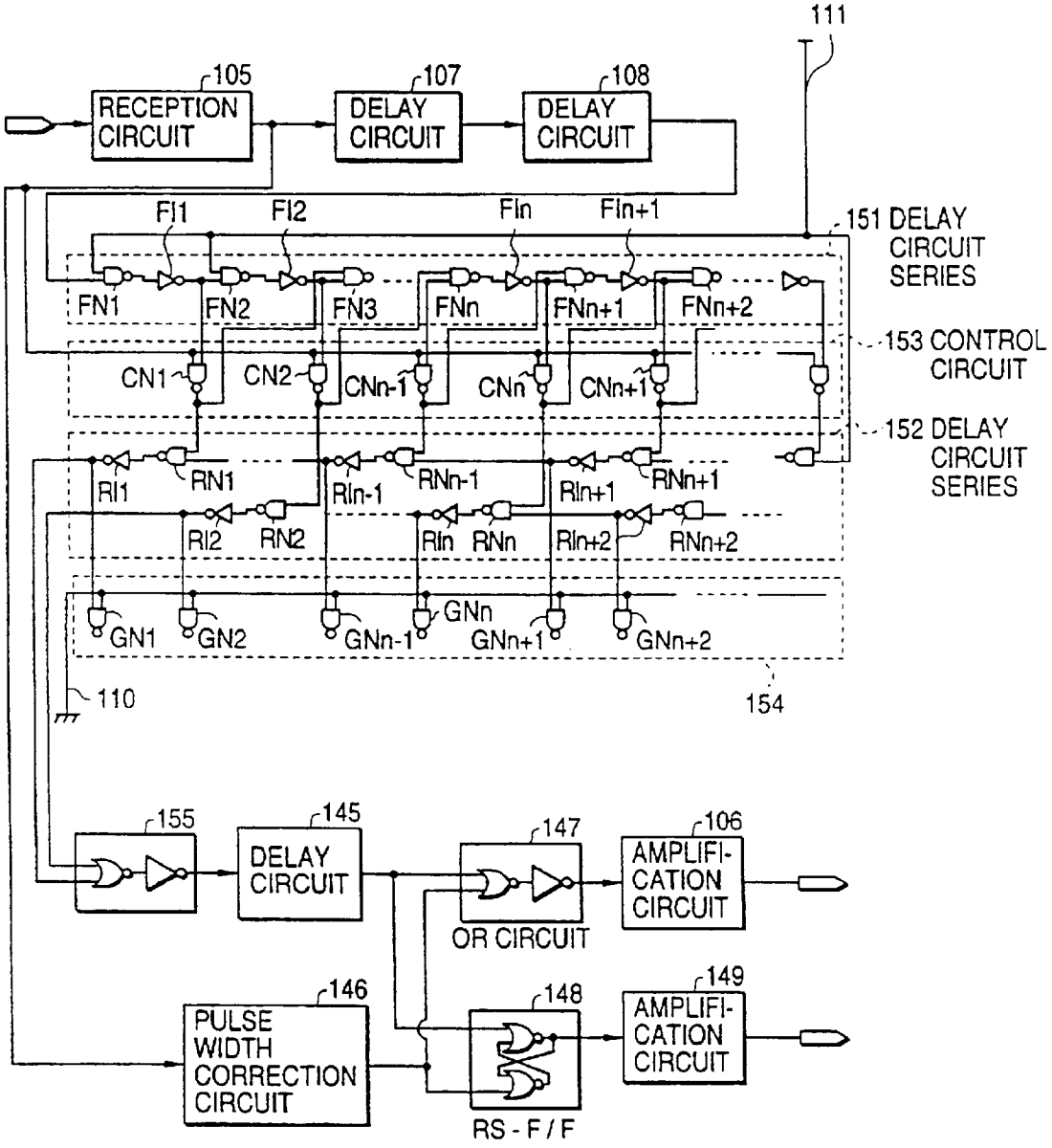
FIG. 20 is a circuit diagram showing the fourth embodiment of the delay circuit device of the present invention.

Referring to FIG. 20, the present embodiment is approximately the same as the circuit of FIG. 18 with the exception that delay circuit series 152 is configured by combining two sets of delay circuit series, the odd-numbered outputs of delay circuit series 151 being connected with one set within delay circuit series 152 by way of control circuit 153, and the even-numbered outputs being connected with the other set of within delay circuit series 152 by way of control circuit 153. The two sets of delay circuit series within delay circuit series 152 are each constructed of half the number of elements of delay circuit series 151, and the delay time is half the time of delay circuit series 151 or delay circuit 102, and in addition, the pulse width transmitted from delay circuit series 151 is half as wide. The output of these two sets of delay circuit series is inputted to delay circuit 145 after taking OR at OR circuit 155.

The present embodiment has the same effect as the seventh embodiment, but by forming two sets of delay circuit series from the odd-numbered and even-numbered outputs of delay circuit series 151 and taking OR, signal resolving power can be improved.

As explained hereinabove, the present embodiment allows generation of a clock pulse of double the cycles with a duty cycle of 50% after one clock pulse, in contrast to the several tens of cycles to several ten thousand cycles required in a conventional PLL. In addition, a combination of the circuits of the first to sixth embodiments allows the generation of a double cycle clock pulse having no phase difference or delay difference with an external clock pulse and the generation of a clock pulse having a duty cycle of 50%. In addition, combining a plurality of these embodiments enables the generation of a clock pulse of four times or eight times the cycles.

The Ninth Embodiment

Figure 21:
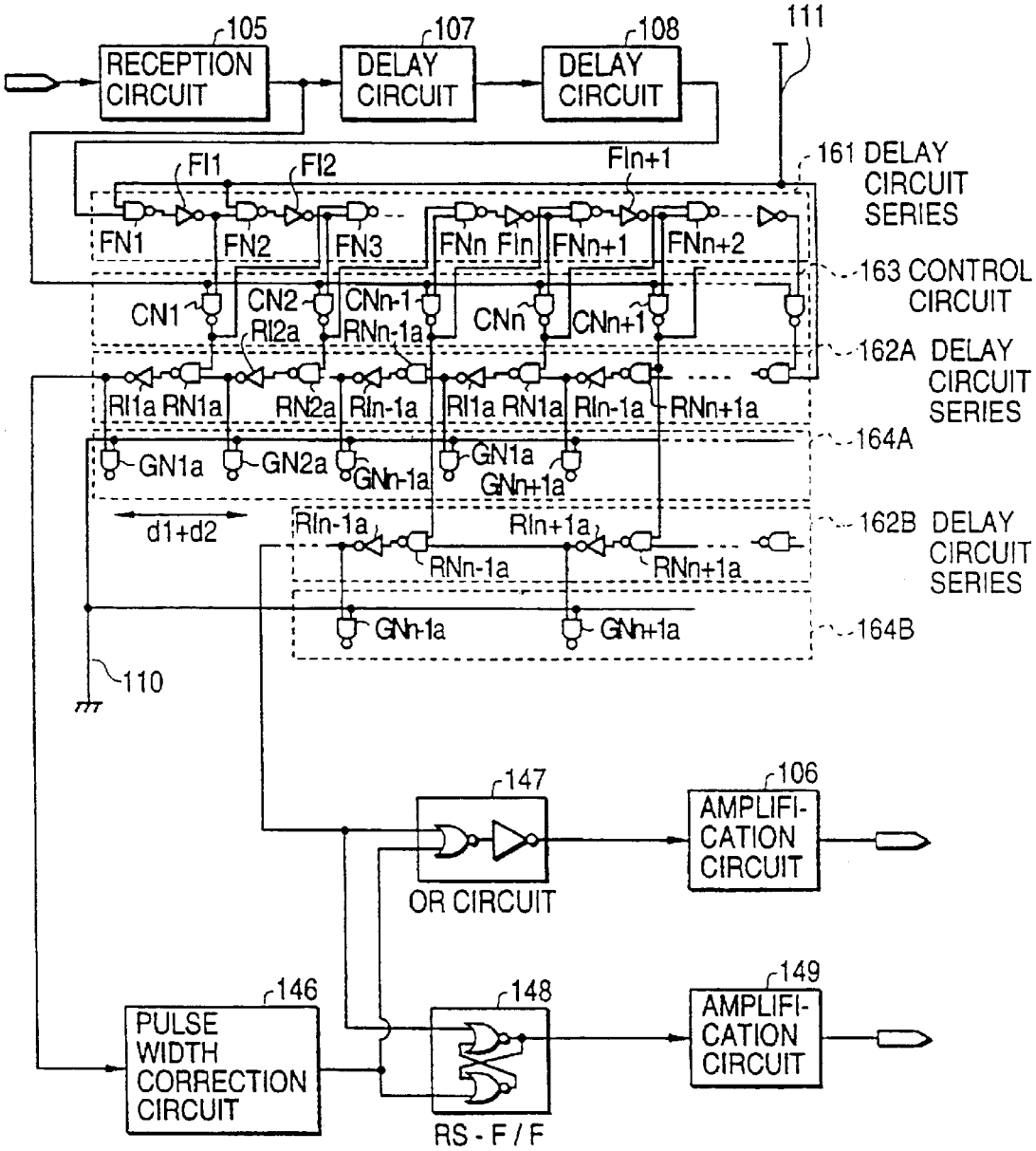
FIG. 21 is a circuit diagram showing the ninth embodiment of the delay circuit device of the present invention.

The ninth embodiment of the present invention will next be explained with reference to FIG. 21. The present embodiment is approximately the same as the circuit of FIG. 18 with the exception that the second delay circuit series is clearly split into two sets of delay circuit series, delay circuit series 162A and delay circuit series 162B, to which are connected load regulation element 164A and load regulation element 164B, respectively. Delay circuit series 162B outputs a clock pulse at a position of delay circuit series 162A lengthened by the combination (d1+d2) of delay time d1 of delay circuit 107 and delay time d2 of delay circuit 108. As a result, although the output of delay circuit series 162A requires d1+tCK+tCK−(d1+d2)=2tCK−d2 from the time of input of an external clock pulse to reception circuit 105 until exit from delay circuit series 162A, d1+tCK+{tCK−2(d1+d2)}/2=tCK+tCK/2−d2 is required until exit from delay circuit series 162B. The same result is obtained for a case in which a clock pulse is used after inversion, as in the seventh embodiment. Therefore, the timing difference between the output of delay circuit series 162A and the output of delay circuit series 162B is one half the clock cycle tCK, and moreover, is a faster timing by delay time d2 of amplification circuit 106. Therefore, the output of amplification circuit 106, which is derived from the output of OR circuit 147 wherein the OR is taken of the output of delay circuit series 162A outputted from pulse width correction circuit 146 and the output of delay circuit series 162B, is a clock synthesized from a clock pulse having no delay with the external clock, and a clock pulse shifted one cycle, and the output of amplification circuit 149 that has passed by way of RS-F/F 148 becomes a clock pulse having a duty cycle of 50% and no delay with the external clock.

This embodiment enables generation of a clock pulse of double cycles having no delay difference or phase difference with an external clock pulse, and generation of a clock pulse having a duty cycle of 50% in 2 cycles. In addition, the OR of the two sets of delay circuit series 162B can be taken as in the eighth embodiment.

The Tenth Embodiment

Figure 22:
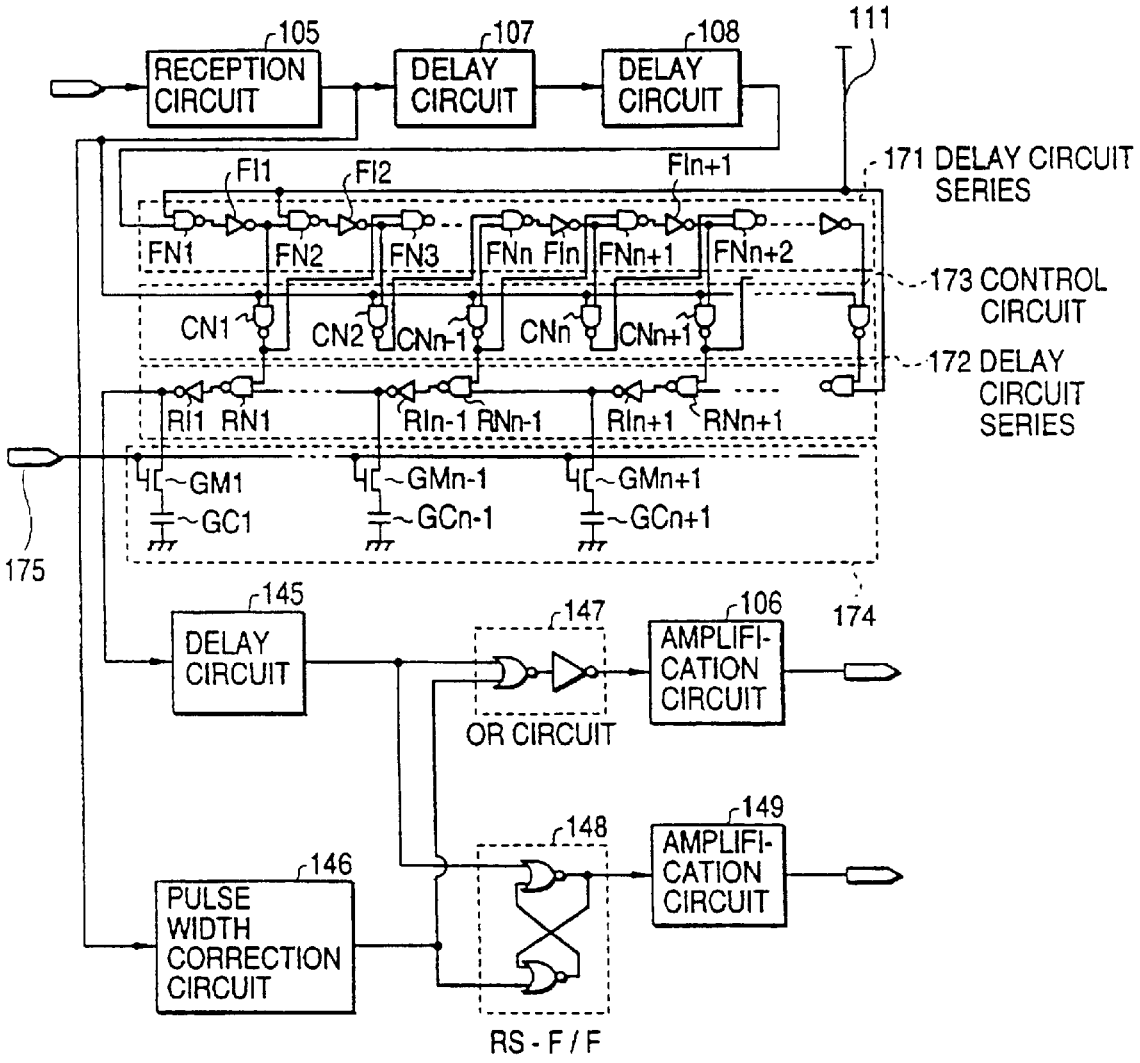
FIG. 22 is a circuit diagram showing the tenth embodiment of the delay circuit device of the present invention.

The tenth embodiment of the present invention will next be explained with reference to FIG. 22. Referring to FIG. 22, the present embodiment is nearly the same as the circuit of FIG. 18 with the exception that load regulation element 174 is made up of NMOS transistors GM1, . . . , GMn, . . . and capacitance elements GC1, . . . , GCn, . . . , instead of NANDs GN1, . . . , GNn, . . . ; capacitance elements GC1, . . . , GCn, . . . , being connected to the output of inverters FI1, . . . , FIn, . . . , within delay circuit series 172 by way of NMOS transistors GM1, . . . GMn, . . . The gate electrodes of the NMOS transistors GM1, . . . , GMn, . . . of load regulation element 174 are connected to load regulation terminal 175, and vary the load of load regulation element 174 through the voltage impressed to the load regulation terminal 175.

The present embodiment enables regulation of the delay time of delay circuit series 172 by regulating the load of load regulation element 174, and in the same way, enables production of clock pulses of any duty cycle and clocks of any frequency.

In the present embodiment, the ratio of the number of circuit elements of delay circuit series 171 to delay circuit series 172 is 2 to 1, but a ratio of 1 to 1 or other ratio may also be applied in this embodiment.

The Eleventh Embodiment

Figure 23:
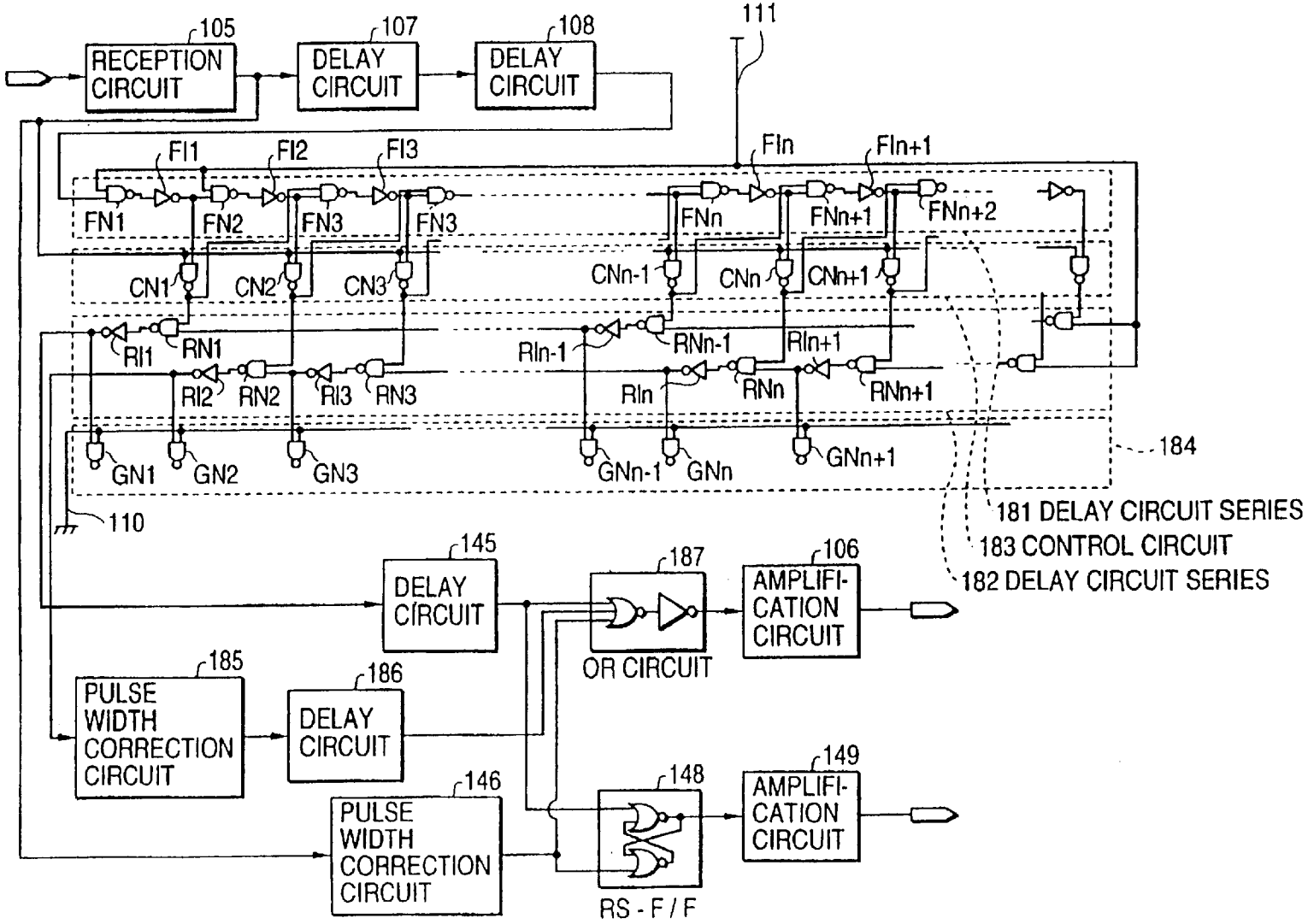
FIG. 23 is a circuit diagram showing the eleventh embodiment of the delay circuit device of the present invention.

The eleventh embodiment of the present invention will next be explained with reference to FIG. 23. Referring to FIG. 23, the present embodiment is nearly the same as the circuit of FIG. 18 with the exception that delay circuit series 182 is made up of two sets of delay circuit series, one set being composed of ⅓ the number of elements of delay circuit series 181, and the other set being composed of ⅔ the number of elements of delay circuit series 181, each of these sets being connected to one of every three outputs or two of every three outputs of delay circuit series 181 by way of control circuit 183.

The outputs of the two delay circuit series of delay circuit series 182 is inverted for use. Of the two delay circuit series of delay circuit series 182, the output of the delay circuit series for ⅓ of the number of elements of delay circuit series 181 is connected to delay circuit 145, the delay time of delay circuit 145 is set to (d1+d2−tPW)/3, and the output of delay circuit 145 is inputted to 3-input OR circuit 187. Of the two delay circuit series of delay circuit series 182, the output of the delay circuit series for ⅔ of the number of elements of delay circuit series 181 is connected to pulse width correction circuit 185, pulse width correction circuit 185 sets the pulse width to ⅓ the output pulse width of reception circuit 105, the output of pulse width correction circuit 185 is connected to delay circuit 186, the delay time of delay circuit 186 is set to (d1+d2−tPW) (⅔), and the output of delay circuit 186 is inputted to 3-input OR circuit 187, the output of reception circuit 105 is connected to pulse width correction circuit 146, pulse width correction circuit 146 sets the pulse width to ⅓ the output pulse width of reception circuit 105, the output of pulse width correction circuit 146 is inputted to 3-input OR circuit 187, and the output of 3-input OR circuit 187 is supplied to internal circuits by way of amplification circuit 106 as a clock pulse having a frequency three times that of the external clock. In addition, the output of delay circuit 145 and the output of pulse width correction circuit 146 are inputted to RS-F/F 148, and the output of RS-F/F 148 is supplied to internal circuits by way of amplification circuit 149 as a clock pulse having a duty cycle of 33%.

In the present embodiment, because the ratio between the delay times of delay circuit series 181 and each of the two delay circuit series within delay circuit series 182 is set to 3 to 1 and 3 to 2, the number of delay circuits of delay circuit series 182 and the number of circuits of load regulation element 184 are set to ⅓ and ⅔ that of delay circuit series 181, respectively, but any ratio values, such as ⅕ or ⅗, can also be chosen to produce clocks pulses having any duty cycle or any frequency. Furthermore, by outputting the output of delay circuit series 182 without an interposed OR circuit 187 or RS-F/F 148, the internal circuits may be supplied with a clock pulse having a timing of ½ or ⅔ with respect to the cycle of the external clock pulse.

The Twelfth Embodiment

Figure 24:
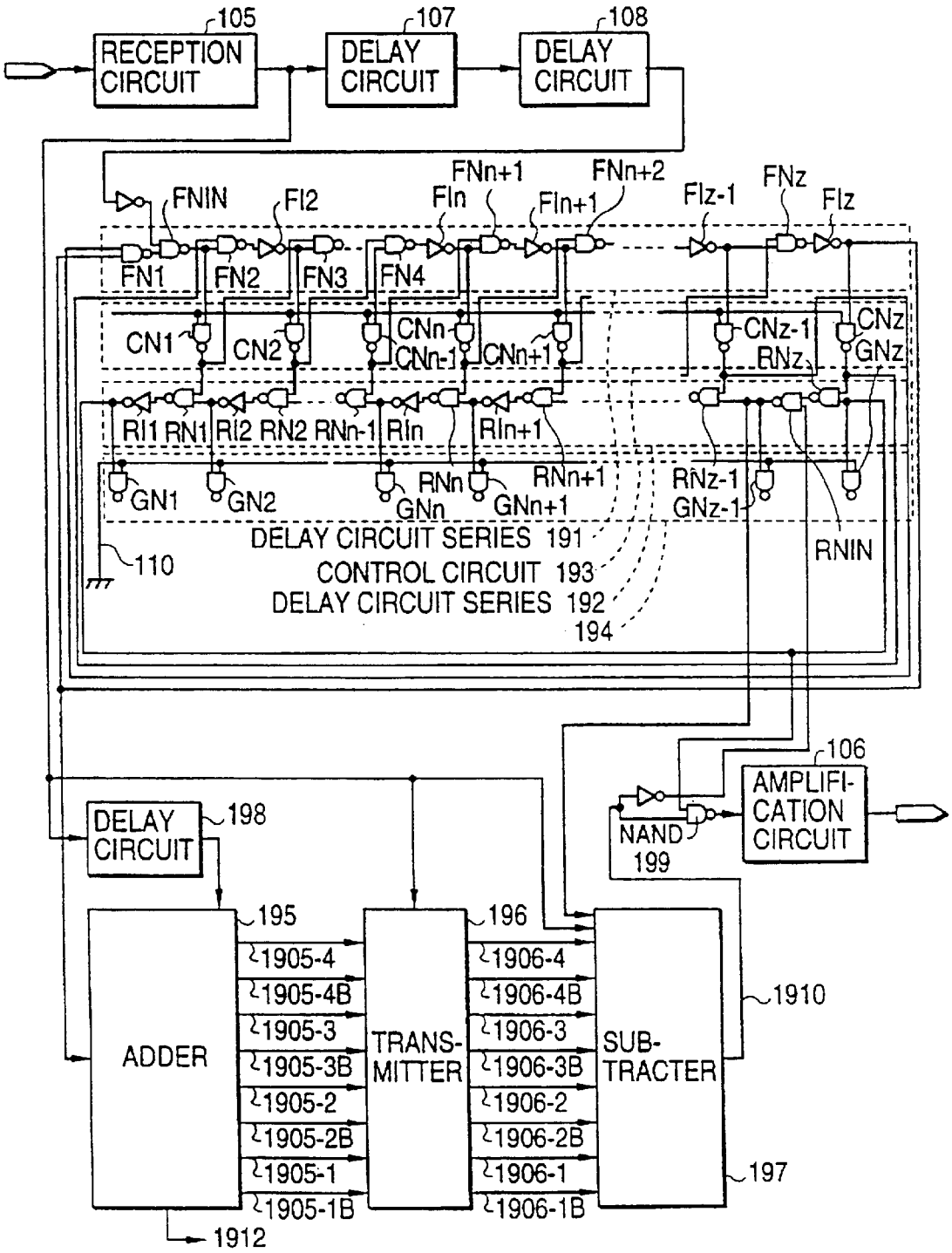
FIG. 24 is a circuit diagram showing the twelfth embodiment of the delay circuit device of the present invention.
Figure 25:
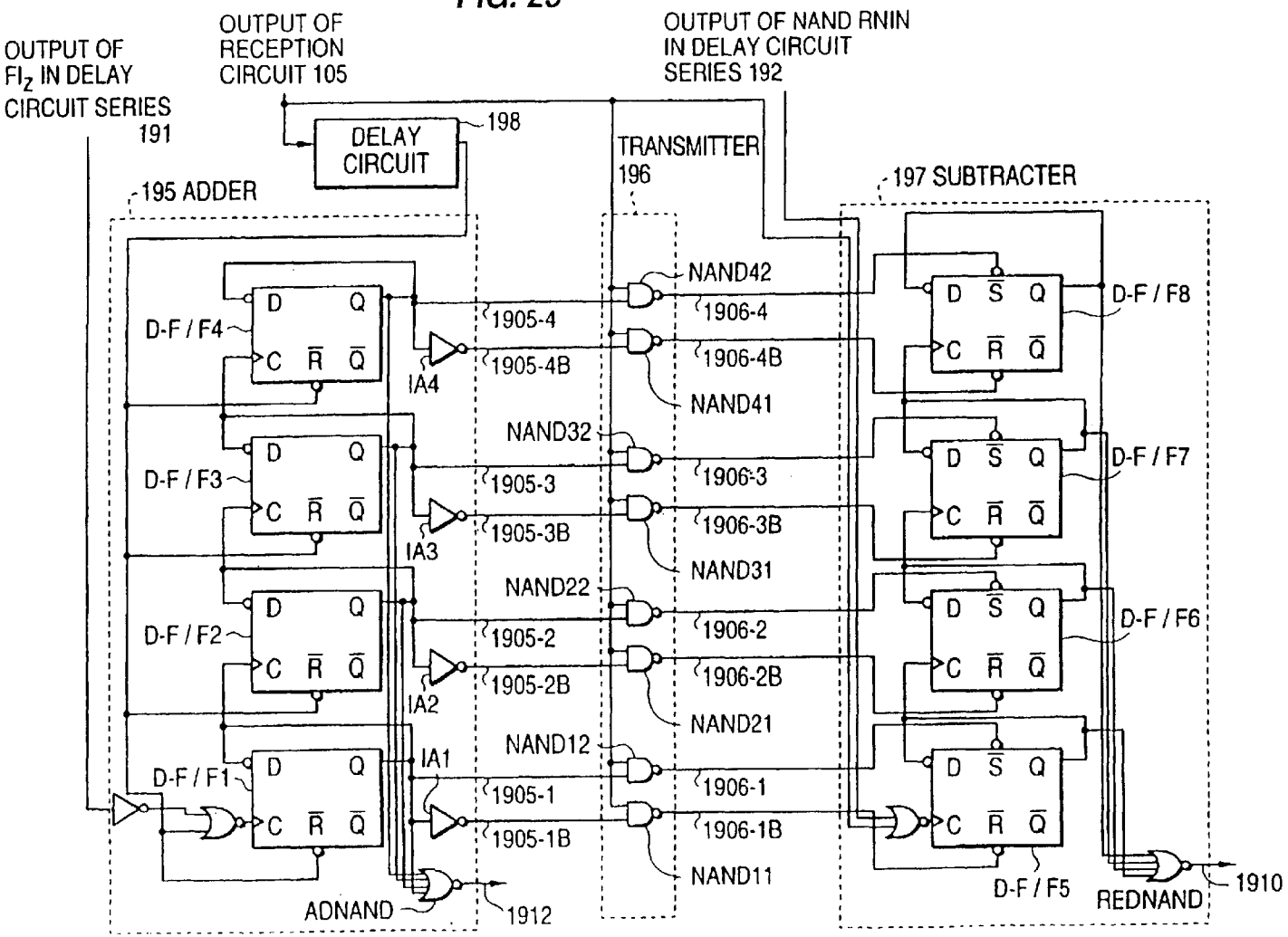
FIG. 25 is a circuit diagram showing adder 195, transmitter 196, and subtracter 197 in the twelfth embodiment.

The twelfth element of the present invention will next be explained with reference to FIGS. 24 and 25. Referring to FIG. 24, the present embodiment includes delay circuit series 191, delay circuit series 192, control circuit 193, and load regulation element 194 which are basically equivalent to delay circuit series 101, 102, control circuit 103 and load regulation element 104, respectively, of FIG. 5; and in addition includes adder 195, transmitter 196, subtracter 197, and delay circuit 198. Delay circuit series 191, delay circuit series 192, control circuit 193, and load regulation element 194 are nearly the same as delay circuit series 101, delay circuit series 102, control circuit 103, load regulation element 104, respectively, of the first embodiment, but the output of the last inverter FIz of delay circuit series 191 is inputted to the first NAND FN1 of delay circuit series 191, the output of the second to last inverter FIz-1 of delay circuit series 191 is inputted to the first NAND FN1 of delay circuit series 191, the output of the second to the last NAND CNz-1 of control circuit 193 is inputted to the first NAND FN1 of delay circuit series 191, the output of the last NAND CNz of control circuit 193 is inputted to the second NAND FN2 of delay circuit series 191, a NAND FNIN is arranged in the next section following FN1 instead of inverter FI1, the output of delay circuit 108 is inputted by way of an inverter, the output of the first inverter RI1 of delay circuit series 192 is inputted to the last NAND RNz of delay circuit series 192, a NAND RNIN is arranged in the next section after the last NAND RNz of delay circuit series 192 instead of inverter RIz, the output 1910 of subtracter 197 is inputted by way of an inverter, and the output of the first inverter RI1 of delay circuit series 192 is inputted to amplification circuit 106 by way of NAND 199.

H pulse output of reception circuit 105 is inputted to delay circuit 107, delay circuit 198, and subtracter 197. The output of delay circuit 107 is inputted to delay circuit series 191 by way of delay circuit 108 and an inverter. The H pulse entering delay circuit series 191 progresses through delay circuit series 191 during the interval until the next H pulse from reception circuit 105 is outputted, and upon arriving at the last inverter FIz of delay circuit series 191, returns to the first NAND FN1 and continues to circulate.

Adder 195 counts the number of H pulses outputted from inverter FIz of delay circuit series 191 during the interval from the output of an H pulse of reception circuit 105 until the output of the next H pulse. In the present embodiment, the output of adder 195 indicates the result of addition as 4-bit outputs 1905-1, 1905-1B, 1905-2, 1905-2B, 1905-3, 1905-3B, 1905-4, and 1905-4B. When an H pulse exits reception circuit 105, the output of adder 195 is transmitted to subtracter 197 by way of transmitter 196 as 4-bit output 1906-1, 1906-1B, 1906-2, 1906-2B, 1906-3, 1906-3B, 1906-4, and 1906-4B. When an H pulse exits reception circuit 105, the H pulse within delay circuit series 191 is transmitted to delay circuit series 192, progresses through delay circuit series 192 as an L pulse, and upon reaching inverter RI1, is inputted to NAND RNz, and again proceeds through delay circuit series 192. The count number transmitted to subtracter 197 by the L pulse output from inverter RI1 of this delay circuit series 192 is subtracted, and when the count number becomes "0", the output 1910 of subtracter 197 changes from L to H, and the output of inverter RNIN oE delay circuit series 192 is fixed at L, and simultaneously, the output of inverter RI1 in delay circuit series 192 is outputted from NAND 199 to amplification circuit 106.

If the H pulse within delay circuit series 191 does not reach the last inverter FIz of delay circuit series 191 during time after its exit from reception circuit 105 until the output of the next H pulse, output 1910 of subtracter 197 remains at H, and as a result, a pulse transmitted from delay circuit series 191 to delay circuit series 192 causes the output of inverter RI1 of delay circuit series 192 to be outputted from NAND 199 to amplification circuit 106.

Furthermore, when the counter of adder 195 indicates a maximum value, i.e., when all of 4-bit outputs 1905-1, 1905-1B, 1905-2, 1905-2B, 1905-3, 1905-3B, 1905-4, and 1905-4B are H outputs, adder 195 outputs maximum cycle violation signal 1912. Accordingly, by exchanging this embodiment with the delay circuit series 101, delay circuit series 102, control circuit 103, load regulation element 104 of the sixth embodiment, if a clock pulse enters which has a cycle that exceeds the maximum controllable cycle of this embodiment, a clock pulse is inputted to amplification circuit 106 that has not passed through the circuit.

Details regarding configurations of adder 195, transmitter 196, subtracter 197, and delay circuit 198 will next be explained with reference to FIG. 25. Adder 195 is made up of four resettable D flip-flop circuits D-F/F 1–4. The NOR output of a signal derived from the output of inverter FIz of delay circuit series 191 that has passed through an inverter and the signal of delay circuit 198 is inputted to the C terminal of D-F/F 1. The Q terminal output 1905 of D-F/F 1 is inputted to the D terminal of D-F/F 1, the C terminal of D-F/F 2, inverter IA1, 4-input NAND ADNAND and NAND12 OF transmitter 196. The output 1905-1B of inverter IA1 is inputted to NANDll of transmitter 196. The Q terminal output 1905-2 of D-F/F 2 is inputted to the D terminal of D-F/F 2, the C terminal of D-F/F 3, inverter IA2, 4-input NAND ADNAND, and NAND22 of transmitter 196. The output 1905-2B of inverter IA2 is inputted to NAND 21 of transmitter 196. The Q terminal output 1905-3 of D-F/F 3 is inputted to the D terminal of D-F/F 3, the C terminal of D-F/F 4, inverter IA3, 4-input NAND ADNAND, and NAND32 of transmitter 196. The output 1905-3B of inverter IA3 is inputted to NAND31 of transmitter 196. The Q terminal output 1905-4 of D-F/F 4 is inputted to the D terminal of D-F/F 4, inverter IA4, 4-input NAND ADNAND, and NAND42 of transmitter 196. Output 1905-4B of inverter IA4 is inputted to NAND41 of transmitter 196. The output of reception circuit 105 is inputted to the other input terminals of NAND11, NAND12, NAND21, NAND22, NAND31, NAND32, NAND41, and NAND42.

Subtracter 197 is made up of four sets of resettable D flip-flops D-F/F 5–8. The NOR output of the output of reception circuit 105 and the output of NAND RNIN of delay circuit series 192 is inputted to the C terminal of D-F/F 5. The output 1906-1B of NAND 11 is inputted to the R terminal of D-F/F 5, and output 1906-1 of NAND12 is inputted to the S terminal of D-F/F 5. The Q terminal output of D-F/F 5 is inputted to the D terminal of D-F/F 5, the C terminal of D-F/F 6, and 4-input NAND REDNAND. Output 1906-2B of NAND21 is inputted to the R terminal of D-F/F 6, and output 1906-2 of NAND22 is inputted to the S terminal of D-F/F 6. The Q terminal output of D-F/F 6 is inputted to the D terminal of D-F/F 6, the C terminal of D-F/F 7, and 4-input NAND REDNAND. Output 1906-3B of NAND31 is inputted to the R terminal of D-F/F 7, and output 1906-3 of NAND32 is inputted to the S terminal of D-F/F 7. The Q terminal output of D-F/F 7 is inputted to the D terminal of D-F/F 7, the C terminal of D-F/F 8, and four input NAND REDNAND. Output 1906-4B of NAND41 is inputted to the R terminal of D-F/F 8, and output 1906-4 of NAND42 is inputted to the S terminal of D-F/F 8. The Q terminal output of D-F/F 8 is inputted to the D terminal of D-F/F 8, and 4-input NAND REDNAND. The output of REDNAND is inputted as the output 1910 of subtracter 197 to NAND 199, and to NAND RNIN by way of an inverter.

As explained hereinabove, in the present embodiment, the connection of delay circuit series 191 and delay circuit series 192 in a loop configuration and the provision of a counter enables control of a clock pulse having a cycle several times longer than the maximum delay time of circuit series 191 and delay circuit series 192 that can be counted at the counter. In other words, if the delay time from any NAND FNn to the following inverter FIn of delay circuit series 191 is defined as dF and the delay time from any NAND RNn to inverter RIn of delay circuit series 192 is defined as dR, the delay time from the first NAND FN1 to the last inverter FIz of delay circuit series 191 is zdF, and the delay time from the first NAND RNz to the last inverter RI1 of delay circuit series 192 is zdR. When the delay between the internal clock pulse and external clock pulse is to be eliminated, dF and dR are set to be equal, and accordingly, zdF and zdR are also equal. At this time, for a case in which the inputted clock pulse cycle is shorter than zdF+d1+d2 (d1+d2 being the sum of the delay times of delay circuit 107 and delay circuit 108), as shown in the first through seventh embodiments, a clock pulse progressing through delay circuit series 191 is transmitted from delay circuit series 191 to delay circuit series 192 with the next clock pulse, and passes through the same number of sections of NANDs and inverters in delay circuit series 191 and delay circuit series 192. In a case in which the inputted clock cycle is longer than zdF+d1+d2, the clock pulse continues to circulate within delay circuit series 191 until input of the next clock pulse, and the number of times the clock pulse passes from end to end of delay circuit series 191 is counted by adder 195. When the pulse is transmitted from delay circuit series 191 to delay circuit series 192 upon entry of the next clock, the number of times the pulse has passed from end to end of delay circuit series 191 counted at adder 195 is simultaneously transmitted to subtracter 197, which subtracts each time a pulse passes through inverter RI1 of delay circuit series 192. Because the clock pulse circulates from end to end of delay circuit series 192 the same number of times as it has passed from end to end of delay circuit series 191, delay circuit series 191 and delay circuit series 192 are used repeatedly. However, as when the inputted clock cycle is shorter than zdF+d1+d2, because the pulse passes through the same number of sections of NANDs and inverters within delay circuit series 181 and delay circuit series 192, the same effect can be expected for a clock of longer cycle.

Further, when the counter of adder 195 indicates the maximum value, maximum cycle violation signal 1912 is outputted from adder 195. As a result, by exchanging delay circuit series 191, delay circuit series 192, control circuit 193, load regulation element 194, adder 195, transmitter 196, subtracter 197, and delay circuit 198 of the present embodiment with delay circuit series 101, delay circuit series 102, control circuit 103, and load regulation element 104 of the sixth embodiment, a clock pulse that has not passed through the circuit is inputted to amplification circuit 106 when a clock pulse enters which has a cycle exceeding the maximum controllable cycle of this embodiment.

Also, by exchanging the delay circuit series 191, delay circuit series 192, control circuit 193, load regulation element 194, adder 195, transmitter 196, subtracter 197, and delay circuit 198 of the present embodiment with the delay circuit series 101, delay circuit series 102, control circuit 103, and load regulation element 104 of the third, fourth and fifth embodiments, the same effect as the third, fourth, and fifth embodiments can be realized over a wider range of frequencies.

In addition, by setting the delay time of delay circuit series 192 to one half the delay time of delay circuit series 191, the same effect as the seventh embodiment can be realized over a wider range of frequencies.

The Thirteenth Embodiment

Figure 26:
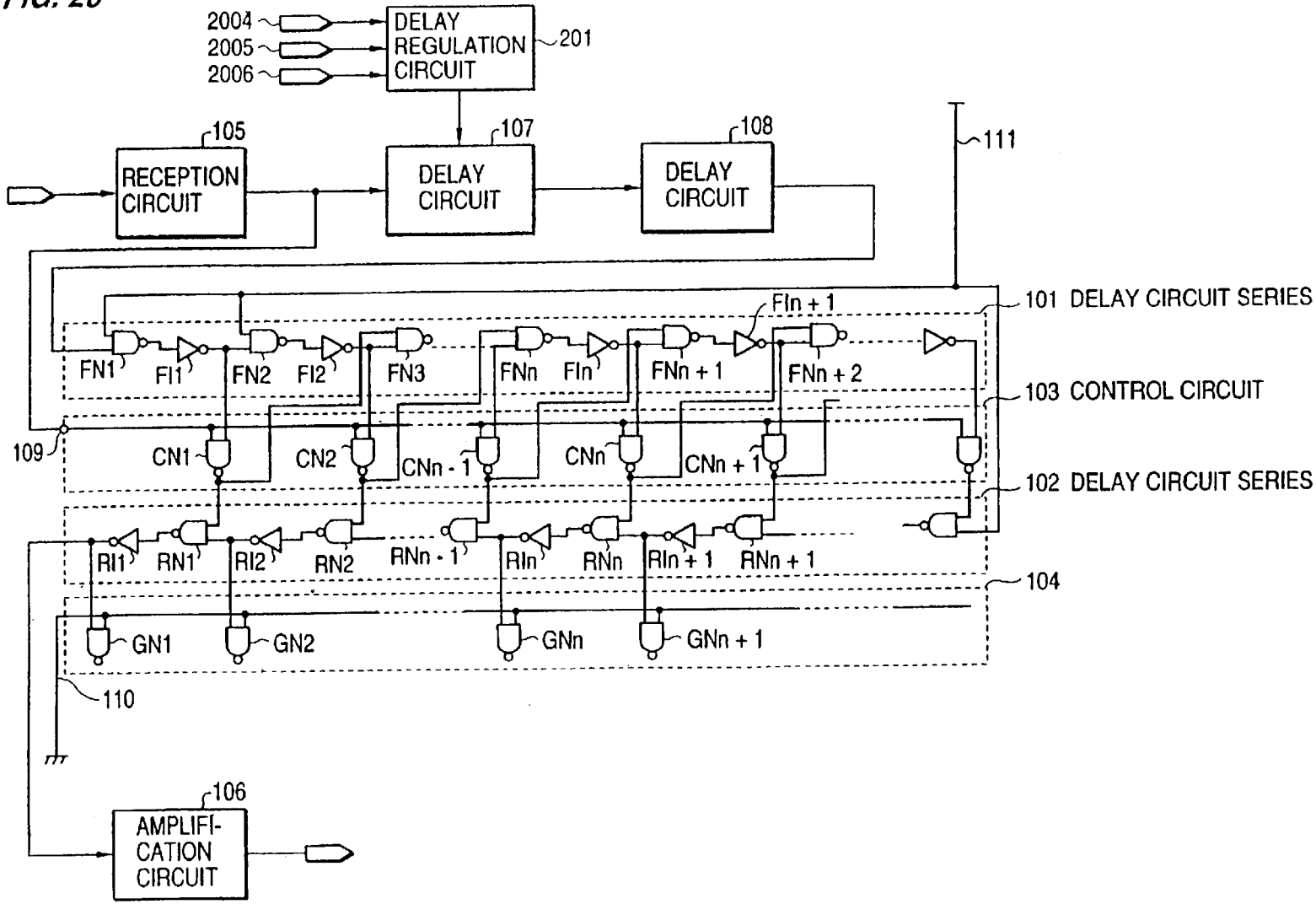
FIG. 26 is a circuit diagram showing the thirteenth embodiment of the delay circuit device of the present invention.
Figure 27:
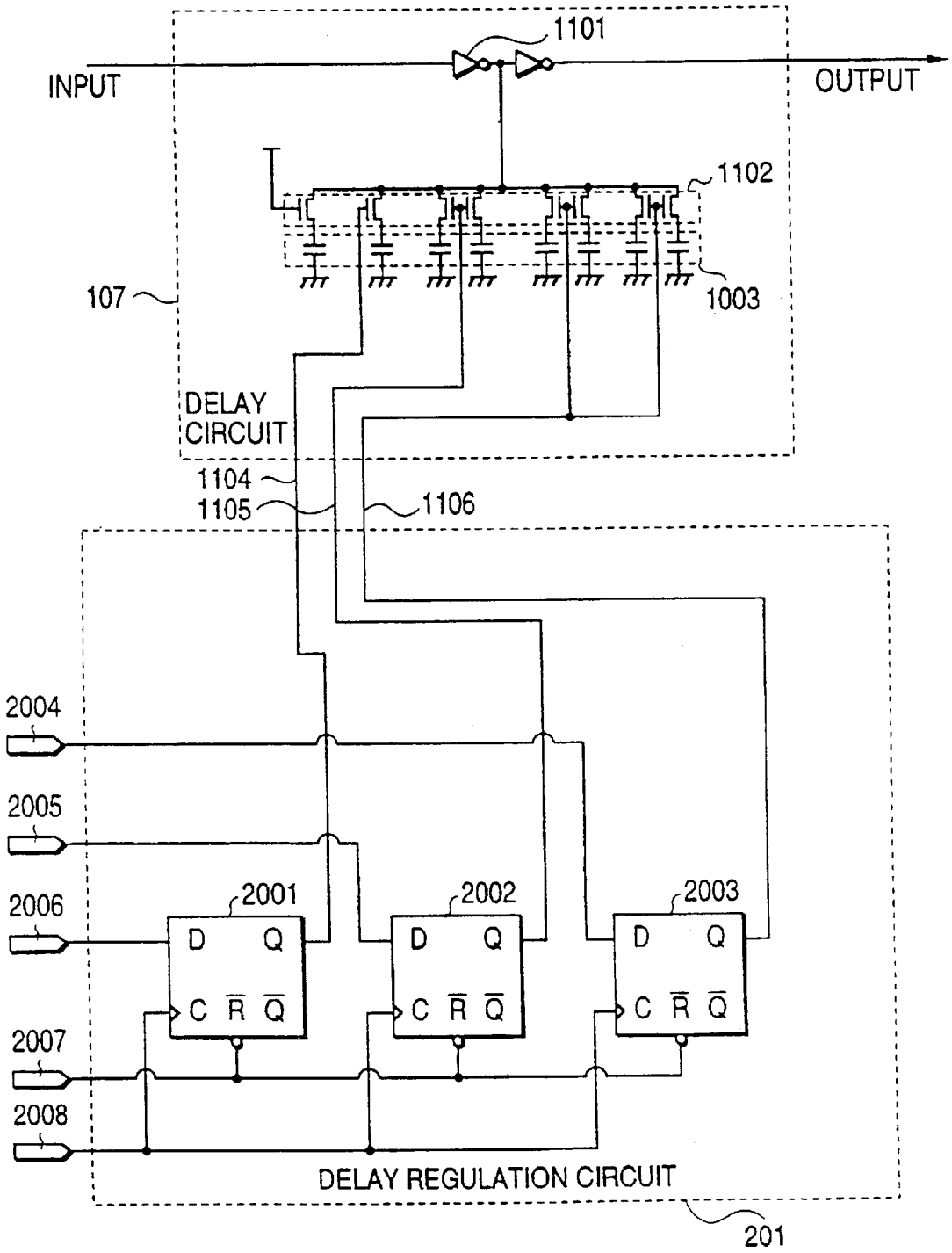
FIG. 27 is a circuit diagram showing delay circuit device 201 according to the thirteenth embodiment of the present invention.

The thirteenth embodiment of the present invention will next be explained with reference to FIGS. 26 and 27. Referring to FIG. 26, the present embodiment provides a delay regulation circuit 201 in place of delay regulation circuit 115 of FIG. 9. As shown in FIG. 27, the configuration of delay circuit 107 in particular is equivalent to that of FIG. 10 in that eight sets of capacitance elements 1103 and transistors 1102 are connected to the node of inverter series 1101, the transistors 1102 being interposed between capacitance elements 1103 and the node of inverter series 1101; one transistor 1103 being constantly in a conductive state, and of the other transistors, one being controlled by signal 1104, two being controlled by signal 1105, and four being controlled by signal 1106; and the capacitance value connected to transistor 1102 having levels in 2 to the third power, i.e., 8 steps, and delay circuit 107 having delay times in eight steps. However, each of signals 1104, 1105, 1106 are independently controlled by register 2001, register 2002, register 2003, respectively, within delay regulation circuit 201. The output levels of register 2001, register 2002, and register 2003 are determined by the connection states of external signal 2004, external signal 2005, and external signal 2006 and by setting signal 2007 and setting release signal 2008.

Figure 28:
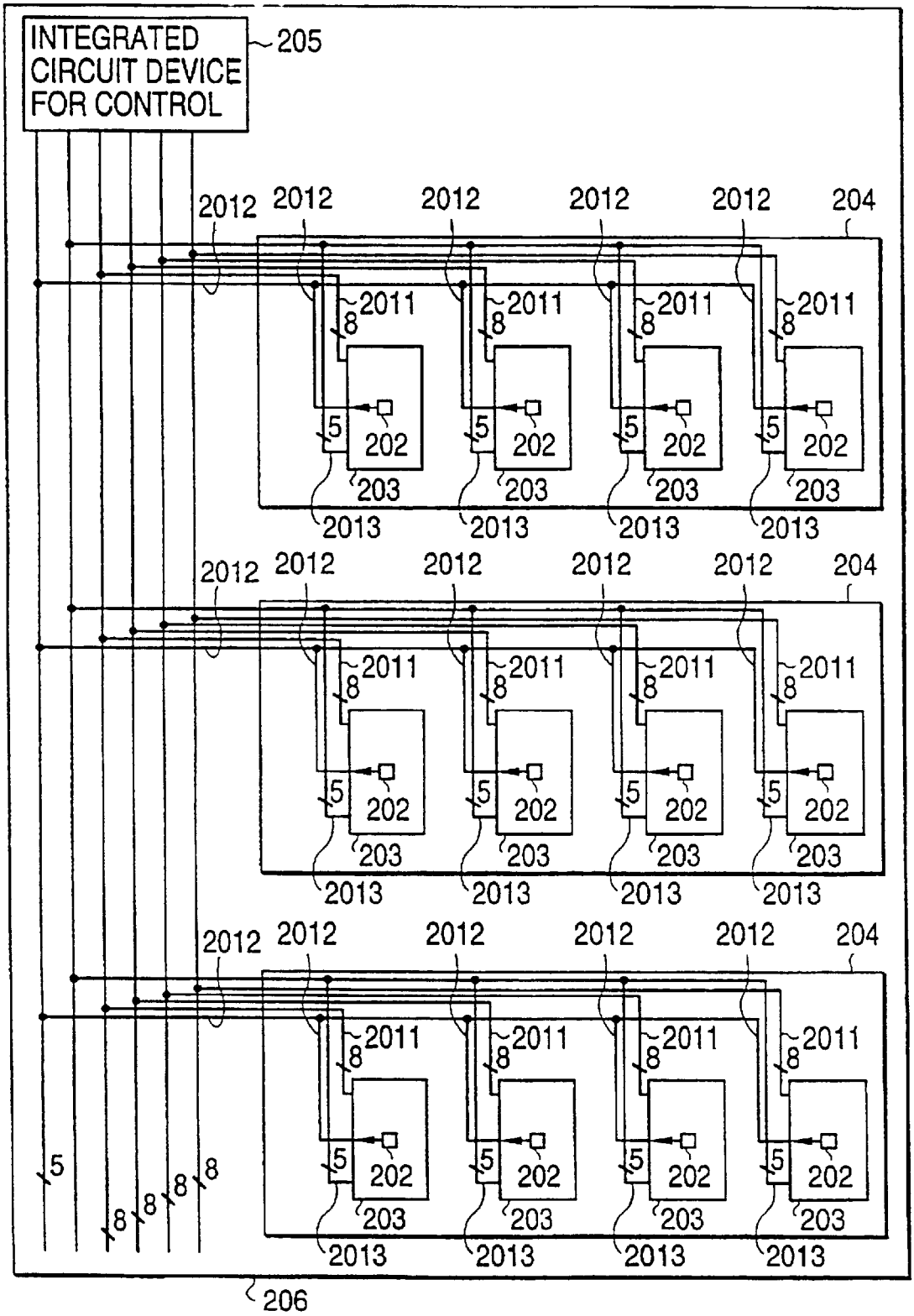
FIG. 28 is a view showing the thirteenth embodiment of the delay circuit device installed in a semiconductor device.

In the present embodiment, the delay times of delay circuit 107 can be regulated by external signals 2004–2006, and consequently, clock pulse timing can be set even after completion of the delay circuit device and installation in a system. In particular, as shown in FIG. 28, a semiconductor device incorporating the delay circuit device 202 of the present invention may for example incorporate a plurality of modules 204 which in turn incorporate a plurality of synchronous dynamic random access memories 203; and an integrated circuit device for control 205 that manages this plurality of modules 204. When data output 2011 of the synchronous dynamic random access memories 203 is received at integrated circuit device for control 205, the output 2012 of a delay circuit device 202 mounted in the same synchronous dynamic random access memory 203 that sent out data output 2011 can be used in the system 206 that takes in the received signal to enable regulation of delay time differences rising due to the position of arrangement of each module 204 through a signal group 2013 composed of external addresses 2004 to 2006 after system installation.

While preferred embodiments of the present invention have been described using specific terms, such description is for illustrative purposes only, and it is to be understood that changes and variations may be made without departing from the spirit or scope of the following claims.

What is claimed is:

1. A delay circuit device comprising:

a first delay circuit series that can extract output from any position on a transmission path of a signal, a second delay circuit series that can enter input from any position on a transmission path of a signal, and a control circuit means having an input terminal, an output terminal, and an input/output control terminal for signals;

wherein said first delay circuit series and said second delay circuit series are arranged such that their signal transmission paths are aligned in opposite directions; output of said first delay circuit series and input of said second delay circuit series being passed through the control circuit means and sequentially connected to each other from the side close to the input of said first delay circuit series and from the side close to the output of said second delay circuit series; and wherein a first signal is inputted to said first delay circuit series, a second signal is inputted to said control circuit at any time thereafter, and said first signal in said first delay circuit series is transferred to said second delay circuit series.

2. A delay circuit device according to claim 1 wherein a second signal is inputted to said control circuit means, said first signal on said first delay circuit series is transferred to said second delay circuit series, and said first signal on said first delay circuit series is removed from said first delay circuit series.

3. A delay circuit device according to claim 1 wherein said first delay circuit series and said second delay circuit series are constructed such that delay times of both series are equal.

4. A delay circuit device according to claim 1 wherein voltage impressed to said first delay circuit series and said second delay circuit series is supplied from a constant-voltage power source.

5. A delay circuit device according to claim 1 wherein, in a circuit having a plurality of voltage sources, voltage impressed to said first delay circuit series and said second delay circuit series is supplies from a relatively high voltage source.

6. A delay circuit device according to claim 1 further comprising a reception circuit means for external signals, an amplification circuit means, a first delay circuit means having a delay time equal to said reception circuit means, and a second delay circuit means having a delay time equal to said amplification circuit means; and where a first signal is inputted to said first delay circuit series after sequentially progressing through said reception circuit means, said first delay circuit means, and said second delay circuit means; a first signal is inputted to said control circuit means after passing through said reception circuit means; and output of said second delay circuit series is inputted to said amplification circuit means.

7. A delay circuit device according to claim 1 wherein said first signal and said second signal are composed of synchronous signal pulses having a fixed cycle within a prescribed permissible range of error; said second signal being a pulse later than said first pulse by a prescribed number of pulses.

8. A delay circuit device according to claim 1 further comprising a third delay circuit means capable of selecting from a plurality of delay times according to a plurality of control signals and a fourth delay circuit means having a configuration equivalent to said third delay circuit means; said third delay circuit means being arranged serially in the input path of said first delay circuit series; said fourth delay circuit means being arranged serially in the output path of said second delay circuit series; and input times of said third delay circuit means and said fourth delay circuit means being controlled so as to be equal.

9. A delay circuit device according to claim 1 wherein said first delay circuit series and said second delay circuit series are principally composed of inverters and NANDs.

10. A delay circuit device according to claim 1 wherein internal circuits of said first delay circuit series and internal circuits of said second delay circuit series are composed of circuit layouts having a mirror-image relation to each other.

11. A delay circuit device according to claim 1 wherein said first signal and said second signal are synchronous signals or pulse signals of continuous clock pulses.

12. A delay circuit device according to claim 6 wherein the sum of delay times of said first delay and said second delay circuit means is set to a time equal to the signal width of external signals subtracted from the sum of the delay time of said reception circuit means and the delay time of said amplification circuit means; a first signal is inputted to said first delay circuit series after having sequentially passed through said reception circuit means, said first delay circuit means, and said second delay circuit means; said first signal is inputted to said control circuit means after passing through said reception circuit means; and the output of said second delay circuit series is inputted to said amplification circuit means after having been inverted.

13. A delay circuit device according to claim 6 configured to allow regulation of a delay time of said first delay circuit means by an electrical signal, and comprising a fuse circuit means for generating said electrical signal.

14. A delay circuit device according to claim 1 further comprising a switching circuit means for switching the path of a signal to a route that passes directly from said reception circuit means to said amplification circuit means without passing through said first delay circuit series, said second delay circuit series, said first delay circuit means, and said second delay circuit means when the interval between said first signal and said second signal is longer than the sum of the maximum delay time of said first delay circuit series, the delay time of said first delay circuit, and the delay time of said second delay circuit means; and for switching the path of a signal from a route that passes directly from said reception circuit means to said amplification path to a route that passes through said first delay circuit series, said second delay circuit series, said first delay circuit means, and said second delay circuit means when the interval between said first signal and said second signal is shorter than the sum of the maximum delay time of said first delay circuit series, the delay time of said first delay circuit means, and the delay time of said second delay circuit means.

15. A delay circuit device according to claim 14 wherein said switching circuit means includes a hysteresis.

16. A delay circuit device according to claim 6 further comprising an activation circuit means that generates a first activation signal and a second activation signal; and wherein said first activation signal activates said reception circuit means; said second activation signal activates input to said first delay circuit series, said second delay circuit series, said first delay circuit means, and said second delay circuit means; and when either said first or said second activation signal is in an inactive state, all signals within said first delay circuit series are removed.

17. A delay circuit device according to claim 16 wherein said activation circuit means is controlled by either an active signal or a power-down signal of a synchronous memory circuit device.

18. A delay circuit device according to claim 6 further comprising a clock output control circuit means that generates an output control signal; and wherein said output control signal controls the output of said first signal or said second signal from said amplification circuit means; and said output control signal is controlled by a read mode signal, a burst mode signal, and a CAS latency signal of said synchronous memory circuit device.

19. A delay circuit device according to claim 1 further comprising a clock pulse mode signal generation circuit means that generates a clock pulse mode signal; and wherein said clock pulse mode signal switches the path of a signal from a route that passes directly from said reception circuit means to said amplification circuit means or to a route that passes through said first delay circuit series, said second delay circuit series, said first delay circuit means, and said second delay circuit means.

20. A delay circuit device according to claim 1 configured to allow regulation of the delay time of said first delay circuit means by an electrical signal; said electrical signal being a signal that eliminates phase difference between an external signal and the output of said amplification circuit means; and further comprising a phase comparison circuit means for generating said electrical signal.

21. A delay circuit device according to claim 1 wherein the delay time of said second delay circuit series is set by a load regulation circuit means connected to said second delay circuit series.

22. A delay circuit device according to claim 21 wherein load of said load regulation circuit means is controlled by a signal for controlling load.

23. A delay circuit device according to claim 1 wherein said second delay circuit series is made up of a plurality of delay circuit series, this plurality of delay circuit series making up said second delay circuit series each having a prescribed delay time ratio with respect to said first delay circuit series; and said first signal and said second signal having various ratios with respect to the cycle of a synchronous signal.

24. A delay circuit device according to claim 6 wherein a fifth delay circuit means is arranged in the next section following said second delay circuit series; the delay time of said first delay circuit series and the delay time of said second delay circuit series are set at a prescribed ratio; the ratio between the sum of the delay time of said first delay circuit means and the delay time of said second delay circuit means and the delay time of said fifth delay circuit means is set to equal the ratio between the delay time of said first delay circuit series and the delay time of said second delay circuit series; and the output of said fifth delay circuit means, the OR output of the output of said fifth delay circuit means and the output of said reception circuit means, the output of an RS flip-flop that takes as reset, inputs the output of said fifth delay circuit means and the output of said reception circuit means, or frequency-divided output of said OR output is inputted to said amplification circuit means.

25. A delay circuit device according to claim 6 wherein a fifth delay circuit means is arranged in the next section following said second delay circuit series; said second delay circuit series is made up of a plurality of delay circuit series; the delay time of said first delay circuit series and the delay time of said second delay circuit series are set at a prescribed ratio; the ratio between the sum of the delay time of said first delay circuit means and the delay time of said second delay circuit means and the delay time of said fifth delay circuit means is set to equal the ratio between the delay time of said first delay circuit series and the delay time of said second delay circuit series; and the output of said fifth delay circuit means, OR output of the output of said fifth delay circuit means and the output of said reception circuit means, the output of an RS flip-flop that takes as reset and set inputs the output of said fifth delay circuit means and the output of said reception circuit means, or frequency-divided output of said OR output is inputted to said amplification circuit means.

26. A delay circuit device according to claim 25 wherein said second delay circuit series is made up of two delay circuit series; the delay time of said first delay circuit series and the delay time each of said two delay circuit series of said second delay circuit series are set at a 2-to-1 ratio; the ratio between the sum of the delay time of said first delay circuit means and the delay time of said second delay circuit means and the delay time of said fifth delay circuit means is set to equal the ratio between the delay time of said first delay circuit series and the delay time of said second delay circuit series; the output of said first delay circuit series is inputted by way of said control circuit means; OR output of the output of said first delay circuit series and the output of said second delay circuit series is inputted to said fifth delay circuit means; and OR output of the output of said fifth delay circuit means and the output of said reception circuit means, the output of an RS flip-flop that takes as reset and set inputs the output of said fifth delay circuit means and the output of said reception circuit means, or the frequency-divided output of said OR output is inputted to said amplification circuit means.

27. A delay circuit device according to claim 24 wherein said second delay circuit series is made up of two delay circuit series; the delay time of said first delay circuit series and the delay time each of said two delay circuit series of said second delay circuit series are set at a 2-to-1 ratio; the ratio between the sum of the delay time of said first delay circuit means and the delay time of said second delay circuit means and the delay time of said fifth delay circuit means is set to equal the ratio between the delay time of said first delay circuit series and the delay time of said second delay circuit series; the output of said first delay circuit series is inputted by way of said control circuit means; OR output of the output of said first delay circuit series and the output of said second delay circuit series is inputted to said fifth delay circuit means; and OR output of the output of said fifth delay circuit means and the output of said reception circuit means, the output of an RS flip-flop that takes as reset and set inputs the output of said fifth delay circuit means and the output of said reception circuit means, or the frequency-divided output of said OR output is inputted to said implication circuit means.

28. A delay circuit device according to claim 1 wherein the ratio between the delay times of said first delay circuit series and said second delay circuit series is set at the ratio between the number of circuits making up said first delay circuit series and the number of circuits making up said second delay circuit series.

29. A delay circuit device according to claim 6 wherein said first delay circuit series and said second delay circuit series are in a loop formation; and which further comprises a counter means which, from an arbitrary time after said first delay circuit series inputs said first signal and until said control circuit means inputs said second signal, counts the number of times said first signal completes laps around said first delay circuit series formed as a loop; and when said control circuit means inputs said second signal, causes said first signal on said first delay circuit series to be transferred to said second delay circuit series, and at the same time, subtracts from the counted number of laps each time said first signal completes a lap around said second delay circuit series, and when said first signal has completed the same number of laps around said second delay circuit series as completed around said first delay circuit series, causes said first signal to be outputted from said second delay circuit series.

30. A delay circuit device according to claim 29 wherein said counter means comprises an adder that counts the number of laps completed by said first signal around said first delay circuit series formed as a loop until said control circuit means inputs said second signal; a transmitter that transfers said first signal on said first delay circuit series to said second delay circuit series when said control circuit means inputs said second signal, and at the same time, outputs the number of laps counted by said adder; and a subtracter that subtracts from said outputted number of laps each time said first signal completes a lap around said second delay circuit series, and when said first signal has completed the same number of laps around said second delay circuit series as completed around said first delay circuit series, outputs said first signals from said second delay circuit series.

31. A delay circuit device according to claim 22 further comprising a switching circuit means that, when said counter indicates a maximum value, switches the path of a signal to a route that passes directly from said reception circuit means to said amplification circuit means without passing through said first delay circuit series, said second delay circuit series, said first delay circuit means and said second delay circuit means; and when a second signal is inputted when said counter means indicates a value less than a maximum value, switches the path of a signal from a route that directly passes from said reception circuit means to said amplification circuit means to a route that passes through said first delay circuit series, said second delay circuit series, said first delay circuit means, and said second delay circuit means.

32. A delay circuit device according to claim 31 wherein said switching circuit means includes a hysteresis.

*33. A delay circuit device comprising:*

*a first delay circuit series including a plurality of first unit delay circuits coupled in series such that an output of a preceding one of said first unit delay circuits is electrically connected to an input of a succeeding one of said first unit delay circuits, an initial one of said first unit delay circuits being provided to receive a clock to be transmitted; and*

*a second delay circuit series including a plurality of second unit delay circuits coupled in series such that an output of a preceding one of said second unit delay circuits is electrically connected to an input of a succeeding one of said second unit delay circuits;*

*wherein said first and second delay circuit series are arranged such that an initial one to a last one of said first unit delay circuits are associated respectively with a last one to an initial one of said second unit delay circuits; and*

*wherein a first clock that is transmitted through said first delay circuit series is, in response to an appearance of a second clock that is to be next transmitted through said first delay circuit series, passed from a first unit delay circuit that is outputting said first clock to an associated one of said second unit delay circuits and then transmitted through remaining ones of said second unit delay circuits and outputted from the last one of said second unit delay circuits.*

*34. The device as claimed in claim 33, wherein said first and second delay circuit series are arranged such that clock transmission paths of said first and second delay circuit series are aligned in an opposite direction to each other.*

*35. The device as claimed in claim 34, wherein a delay time of each of said first unit delay circuits is substantially equal to that of each of said second unit delay circuits.*

*36. The device as claimed in claim 34, wherein a delay time of each of said first unit delay circuits is larger than that of each of said second unit delay circuits.*

*37. The device as claimed in claim 34, further comprising a first circuit supplying the clock to be transmitted to said first delay circuit series, and a second circuit receiving the clock outputted from said second delay circuit series.*

*38. The device as claimed in claim 34, wherein said first clock is no longer transmitted through said first delay circuit series when said first clock is passed to said second delay circuit series.*

*39. A delay circuit device comprising:*

*a first delay circuit series including a plurality of first unit delay circuits coupled in series such that an output of a preceding one of said first unit delay circuits is electrically connected to an input of a succeeding one of said first unit delay circuits, an initial one of said first unit delay circuits being provided to receive a clock to be transmitted; and*

*a second delay circuit series including first and second circuit parts, said first circuit part including a plurality of second unit delay circuits coupled in series such that an output of a preceding one of said second unit delay circuits is electrically connected to an input of a succeeding one of said second unit delay circuits, and said second circuit part including a plurality of third unit delay circuits coupled in series such that an output of a preceding one of said third unit delay circuits is electrically connected to an input of a succeeding one of said third unit delay circuits;*

*wherein said first and second unit delay circuit series are arranged such that odd-numbered ones of said first unit*

*delay circuits are associated respectively with said second unit delay circuits and even-numbered ones of said first unit delay circuits are associated respectively with said third unit delay circuits; and*

*wherein a first clock that is transmitted through said first delay circuit series is, in response to an appearance of a second clock that is to be next transmitted through said first delay circuit series, passed from a first unit delay circuit that is outputting said first clock to an associated one of said second or third unit delay circuits and then transferred through remaining ones of said second or third unit delay circuits and outputted from the last one of one of said second or third unit delay circuits.*

*40. The device as claimed in claim 39, further comprising a gate circuit coupled to said first and second circuit parts to perform a logical sum on outputs of said first and second circuit paths.*

*41. The device as claimed in claim 39, wherein said first clock is no longer transmitted through said first delay circuit series when said first clock is passed to one of said first and second circuit parts of said second delay circuit series.*

*42. A delay circuit device comprising:*

*a first delay circuit series including a plurality of first unit delay circuits coupled in series such that an output of a preceding one of said first unit delay circuits is electrically connected to an input of a succeeding one of said first unit delay circuits, an initial one of said first unit delay circuits being provided to receive a clock to be transmitted; and*

*a second delay circuit series including a plurality of second unit delay circuits coupled in series such that an output of a preceding one of said second unit delay circuits is electrically connected to an input of a succeeding one of said second unit delay circuits;*

*wherein said first and second delay circuit series are arranged such that an initial one to a last one of said first unit delay circuits are associated respectively with a last one to an initial one of said second unit delay circuits; and*

*wherein a first clock that is fed to said initial one of the first unit delay circuits and then transmitted through said first delay circuit series is passed from a first unit delay circuit that is outputting said first clock to an associated one of said second unit delay circuits in response to a second clock signal, said second clock signal being fed to said initial one of the first unit delay circuits and transmitted through said first delay circuit series one clock cycle after said first clock signal, said first clock signal then transmitted through remaining ones of said second unit delay circuits and outputted from the last one of said second unit delay circuits.*

*43. The device as claimed in claim 42, wherein said first and second delay circuit series are arranged such that clock transmission paths of said first and second delay circuit series are aligned in an opposite direction to each other.*

*44. The device as claimed in claim 43, wherein a delay time of each of said first unit delay circuits is substantially equal to that of each of said second unit delay circuits.*

*45. The device as claimed in claim 43, wherein a delay time of each of said first unit delay circuits is larger than that of each of said second unit delay circuits.*

*46. The device as claimed in claim 43, further comprising a first circuit supplying the clock to be transmitted to said first delay circuit series, and a second circuit receiving the clock outputted from said second delay circuit series.*

*47. The device as claimed in claim 43, wherein said first clock is no longer transmitted through said first delay circuit series when said first clock is passed to said second delay circuit series.*

*48. A method of generating an internal signal having no phase difference with an external signal, said method comprising the steps of:*

*delaying the external signal to produce a first delayed signal;*

*delaying the first delayed signal to produce a second delayed signal;*

*transmitting the second delayed signal through a first delay circuit series including a plurality of first unit delay circuits coupled in series such that an output of a preceding one of said first unit delay circuits is electrically connected to an input of a succeeding one of said first unit delay circuits, an initial one of said first unit delay circuits receiving the second delayed signal;*

*comparing the second delayed signal transmitted through the first delay circuit series with the first delayed signal at an output of the first unit delay circuits;*

*supplying the second delayed signal appearing at an output of one of the first unit delay circuits to a second delay circuit series as a third delayed signal based on the step of comparing, wherein the second delay circuit series includes a plurality of second unit delay circuits coupled in series such that an output of a preceding one of said second unit delay circuits is electrically connected to an input of a succeeding one of said second unit delay circuits, and said second delay circuit series is arranged such that an initial one to a last one of said second unit delay circuits are associated respectively with a last one to an initial one of said first unit delay circuits, and wherein the third delayed signal is supplied to one of the second unit delay circuits associated with the first unit delay circuit from which the third delayed signal was output;*

*transmitting the third delayed signal through remaining ones of said second unit delay circuits to generate a fourth delayed signal; and*

*delaying the fourth delayed signal to produce the internal signal having no phase difference with the external signal.*

*49. A method according to claim 48, wherein the amount of delay added to the second delayed signal from the first delayed signal is equal to the sum of the amount of delay added to the first delayed signal from the external signal and the amount of delay added to the fourth delayed signal to produce the internal signal.*

*50. A method according to claim 48, wherein the third delayed signal is supplied to the second delay circuit series when the first delayed signal goes to a high level.*

* * * * *